United States Patent
Nakamura et al.

(10) Patent No.: US 6,914,835 B2
(45) Date of Patent: Jul. 5, 2005

(54) SEMICONDUCTOR MEMORY DEVICE, AND SEMICONDUCTOR DEVICE WITH THE SEMICONDUCTOR MEMORY DEVICE AND LOGIC CIRCUIT DEVICE THEREIN

(75) Inventors: Toshihiro Nakamura, Takatsuki (JP); Kiyoto Ota, Takatsuki (JP); Masahisa Iida, Takatsuki (JP); Kenichi Origasa, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/786,708

(22) Filed: Feb. 24, 2004

(65) Prior Publication Data

US 2004/0174726 A1 Sep. 9, 2004

(30) Foreign Application Priority Data

Mar. 6, 2003 (JP) .................................... 2003-060530

(51) Int. Cl.$^7$ .............................................. G11C 7/00
(52) U.S. Cl. .................................. 365/203; 365/189.09
(58) Field of Search ............................... 365/203, 226, 365/189.05, 189.06, 189.11

(56) References Cited

U.S. PATENT DOCUMENTS

| 5,914,867 | A | * | 6/1999 | Pascucci .................... 363/60 |
| 6,201,378 | B1 | | 3/2001 | Eto et al. |
| 6,326,837 | B1 | * | 12/2001 | Matano .................... 327/545 |
| 6,452,833 | B2 | * | 9/2002 | Akita et al. ................ 365/203 |
| 6,842,388 | B2 | * | 1/2005 | Origasa et al. ............ 365/203 |
| 2003/0095430 | A1 | | 5/2003 | Origasa et al. |

FOREIGN PATENT DOCUMENTS

| JP | 2000-30450 | 1/2000 |
| JP | 2003-157674 | 5/2003 |

* cited by examiner

*Primary Examiner*—Gene N. Auduong
(74) *Attorney, Agent, or Firm*—Hamre, Schumann, Mueller & Larson P.C.

(57) ABSTRACT

There is provided a semiconductor memory device in which a bit line precharge operation is increased in speed, and a layout area is reduced. P-channel transistors (206, 207) that function as switches are provided in a precharge voltage pumping circuit (105) included in a bit line precharge voltage generation unit. This enhances a pumping efficiency, and reduces a capacitance area of a pumping capacitor (200).

43 Claims, 18 Drawing Sheets

SEMICONDUCTOR MEMORY DEVICE, AND SEMICONDUCTOR DEVICE WITH THE SEMICONDUCTOR MEMORY DEVICE AND LOGIC CIRCUIT DEVICE THEREIN

BACKGROUND OF THE INVENTION

1. Field of the Invention

The present invention relates to a semiconductor memory device, in particular, to a semiconductor memory device in which a power supply block is mounted, capable of performing a precharge operation at a high speed in a case where a precharge potential of a bit line is different from a midpoint potential of the potentials of paired bit lines in a dynamic random access memory (DRAM). The present invention also relates to a semiconductor device with such a semiconductor memory device and a logic circuit device therein.

2. Description of the Related Art

Hereinafter, the circuit configuration and operation of a semiconductor memory device in which a conventional power supply block is mounted will be described with reference to the drawings.

FIG. 13 is a functional block diagram showing a configuration of a general DRAM 1300. In FIG. 13, reference numeral 1301 denotes a memory cell array, 1302 denotes a memory cell array block, 1303 denotes a power supply block, 1304 denotes a row decoder, 1305 denotes a column decoder, 1306 denotes a control circuit, 1307 denotes an I/O buffer, CLK denotes an external clock signal, NRAS denotes a row address strobe signal, NCAS denotes a column address strobe signal, NWE denotes a writing control signal, ADDR denotes an address, REF denotes a refresh control signal, RAD denotes a row address signal, CAD denotes a column address signal, WEN denotes a writing enable signal, SE denotes an access control signal, DI denotes a data input signal, DO denotes a data output signal, VCP denotes a memory cell plate voltage, and VBP denotes a bit line precharge voltage.

The memory cell array 1301 includes a plurality of memory cell array blocks 1302. Each memory cell array block 1302 is supplied with voltages required for the memory cell array 1301, such as a bit line precharge voltage VBP, a memory cell plate voltage VCP, and the like, from the power supply block 1303.

Furthermore, each memory cell array block 1302 is controlled with a bit line precharge starting signal NEQ, sense amplifier starting signals SAN and SAP, and a word line driving signal WL [63:0] from the row decoder 1304. Furthermore, each memory cell array block 1302 is connected to the column decoder 1305.

The row decoder 1304 is supplied with the access control signal SE and the row address signal RAD from the control circuit 1306. The column decoder 1305 is supplied with the writing enable signal WEN and the column address signal CAD from the control circuit 1306.

The control circuit 1306 is supplied with the external clock signal CLK, the row address strobe signal NRAS, the column address strobe signal NCAS, the writing control signal NEW, the address ADDR, and the refresh control signal REF.

The column decoder 1305 is connected to the I/O buffer 1307. The I/O buffer 1307 receives the data input signal DI from outside, and outputs the data output signal DO to outside.

FIG. 14 is a circuit diagram of the memory cell array block 1302. In FIG. 14, reference numeral 1400 denotes a memory cell, 1401 denotes a sense amplifier, 1402 denotes a bit line precharge circuit, BL[i] (i=0, 1, 2, . . . , n) denotes bit lines, /BL[i] (i=0, 1, 2, . . . , n) denotes bit lines to be paired with BL[i], 1403 denotes an access transistor, and 1404 denotes a capacitor.

The memory cell 1400 is composed of one P-channel transistor 1403 and one capacitor 1404. A source of the P-channel transistor 1403 is connected to the bit line BL[i] or /BL[i], a drain thereof is connected to the capacitor 1404, and a gate thereof is supplied with the word line driving signal WL[i] (i=0, 1, . . . ). The other node of the capacitor 1404 is supplied with the memory cell plate voltage VCP.

The sense amplifier 1401 is a general cross-coupling type, and is connected to the bit lines BL[i] and /BL[i] to be paired. The sense amplifier 1401 is controlled with the sense amplifier starting signals SAN and SAP.

The bit line precharge circuit 1402 is composed of three P-channel transistors: a transistor having a source connected to the bit line BL[i], a drain connected to the bit line /BL[i], and a gate supplied with the bit line precharge starting signal NEQ; a transistor having a source connected to the bit line BL[i], a drain supplied with the bit line precharge voltage VBP, and a gate supplied with the bit line precharge starting signal NEQ; and a transistor having a source supplied with the bit line precharge voltage VBP, a drain connected to the bit line /BL[i], and a gate supplied with the bit line precharge starting signal NEQ (see JP 2003-157674 A).

FIG. 15 is a schematic view showing a circuit block and a power supply wiring net of the bit line precharge voltage VBP in a conventional semiconductor memory device. In FIG. 15, reference numeral 1500 denotes a memory cell array having the same configuration as that of the memory cell array 1301 shown in FIG. 13, 1501 denotes a power supply block, 1502 denotes a power supply unit (PU), 1503 denotes a charging/discharging control circuit (CDC), 1504 denotes a reference voltage generation circuit (RVG), and 1505 denotes a precharge voltage pumping circuit (PVP).

On the memory cell array 1500, power supply wires are provided for the bit line precharge voltage VBP to be supplied to the bit line precharge circuit 1402, placed in a plurality of memory cell array blocks 1302. VBP[i] (i=0, 1, 2, . . . , n−1, n) denotes bit line precharge power supply wires, which are represented as VBP[0], VBP[1], . . . , VBP[n−1], and VBP[n] from the side close to the power supply block 1501. The bit line precharge power supply wires VBP[i] are placed in a column direction on a wiring layer of an upper layer of each memory cell array block 1302 (represented by a solid line in FIG. 15). The bit line precharge power supply wires VBP[i] are connected respectively in a row direction with metal wires (represented by broken lines in FIG. 15) so as to decrease an impedance. The bit line precharge power supply wires VBP[i] are placed in a mesh shape, and the thickest possible wires are used. The bit line precharge power supply wires VBP[i] are connected to the bit line precharge voltage generation circuit 1504.

FIG. 16 is a circuit diagram showing internal configurations of the bit line precharge voltage generation circuit 1504 (for example, see JP 2000-30450 A) and the precharge voltage pumping circuit 1505 shown in FIG. 15. In FIG. 16, the precharge voltage pumping circuit 1505 is composed of a pumping capacitor 1600, a first P-channel transistor 1601, a second P-channel transistor 1602, a first N-channel transistor 1603, an inverter 1604, and a buffer inverter 1605. CPND denotes a charge accumulation node, and AP, NAP, and ACP denote transfer gate connection signals.

One electrode of the pumping capacitor 1600 is connected to drains of the first P-channel transistor 1601, the second P-channel transistor 1602, and the first N-channel transistor 1603. The other electrode of the pumping capacitor 1600 is dropped to a ground potential VSS. A capacitance Ccap of the pumping capacitor 1600 is required to accumulate (VBPREF−½ VDD)×Cbl, which is equal to the charge required for charging the potential of paired bit lines BL[n], /BL[n] to the bit line precharge reference voltage VBPREF, assuming that the total capacitance of the paired bit lines BL[n], /BL[n] to be simultaneously precharged is Cbl. During operation, considering the charge supplied from an operational amplifier 1607, the pumping capacitor 1600 having the capacitance Ccap satisfying the relationship: Ccap<(VBPREF−½ VDD)/(VDD−VBPREF)×Cbl is used.

A gate of the first P-channel transistor 1601 is supplied with a transfer gate connection signal AP, and a source thereof is supplied with a supply voltage VDD. A gate of the second P-channel transistor 1602 is supplied with a transfer gate connection signal NAP, and a source thereof is connected to the bit line precharge power supply wire VBP[0]. A gate of the first N-channel transistor 1603 is supplied with a transfer gate connection signal AP, and a source thereof is connected to the bit line precharge power supply wire VBP[0]. The inverter 1604 receives the transfer gate connection signal AP, and outputs the transfer gate connection signal NAP. The buffer inverter 1605 is composed of inverters in even-number stages connected in series. The buffer inverter 1605 receives the transfer gate connection signal ACP and outputs the transfer gate connection signal AP.

The bit line precharge voltage generation circuit 1504 is composed of a reference voltage generation circuit 1606, an operational amplifier 1607, and a P-channel transistor 1608. VBPREF denotes a bit line-precharge reference voltage, VOUT denotes a bit line precharge holding voltage, and PEN denotes a driver enable signal. The reference voltage generation circuit 1606 generates the bit line precharge reference voltage VBPREF and the bit line precharge holding voltage VOUT. The bit line precharge reference voltage VBPREF is supplied to an inversion input terminal (−) of the operational amplifier 1607, and the bit line precharge holding voltage VOUT is supplied to the bit line precharge power supply wire VBP[0]. A non-inversion input terminal (+) of the operational amplifier 1607 is connected to the bit line precharge power supply wire VBP[0]. The driver enable signal PEN is output from the operation amplifier 1607, and input to the gate of the P-channel transistor 1608. A source of the P-channel transistor 1608 is supplied with a supply voltage VDD, and a drain thereof is connected to the bit line precharge power supply wire VBP[0].

FIG. 17 is a circuit diagram showing an internal configuration of the charging/discharging control circuit 1503 shown in FIG. 15. In FIG. 17, reference numeral 1701 denotes a first delay element, 1702 denotes a second delay element, 1703 denotes an inverter, and 1704 denotes a NOR element. The first delay element 1701 delays the bit line precharge starting signal NEQ by a delay time τ1, and sends it to the second delay element 1702 and one input terminal of the NOR element 1704. The second delay element 1702 delays an input signal by a delay time τ2, and sends it to the inverter 1703. An output signal of the inverter 1703 is sent to the other input terminal of the NOR element 1704. The NOR element 1704 outputs the transfer gate connection signal ACP.

Next, the operation during precharge of a bit line in a semiconductor memory device configured as described will be described with reference to FIG. 18.

FIG. 18 is a timing chart showing a voltage and a current of a signal in each portion in FIGS. 14 to 17.

When the bit line precharge starting signal NEQ is lowered to activate the bit line precharge circuit 1402, the potentials of paired bit lines BL[n], /BL[n] set to be VDD and VSS, respectively, by the sense amplifier 1401 are equalized and attempted to be charged to the potential of ½ VDD. Simultaneously, the bit line precharge circuit 1402 connects the paired bit lines BL[n], /BL[n] to the bit line precharge power supply wire VBP[n], and attempts to charge them to the bit line precharge voltage VBP. At this time, a current is consumed, and a voltage drop occurs.

When the voltage drop occurs in the bit line precharge power supply wire VBP[n], the voltage drop is transmitted to the bit line precharge power supply wire VBP[0] through the wires connected in a mesh shape. Upon detecting the voltage drop, the operational amplifier 1607 in the bit line precharge voltage generation circuit 1504 is activated. However, it takes a time for a current ia from by the P-channel transistor 1608 to increase.

In the case where the bit line precharge starting signal NEQ is at a high level, the transfer gate connection signal AP in the precharge voltage pumping circuit 1505 is at a low level, whereas the transfer gate connection signal NAP is at a high level. Therefore, the second P-channel transistor 1602 and the first N-channel transistor 1603 are in an OFF state, and the first P-channel transistor 1601 is in an ON state. The charge accumulation node CPND is charged to a high level, and charge is accumulated in the pumping capacitor 1600.

Next, when the bit line precharge starting signal NEQ is lowered, after the delay time τ1 determined by the first delay element 1701 in the charging/discharging control circuit 1503, the transfer gate connection signal AP is turned to be high, and the transfer gate connection signal NAP is turned to be low. The first P-channel transistor 1601 is turned off, and the second P-channel transistor 1602 and the first N-channel transistor 1603 are turned on. Because of this, the pumping capacitor 1600 and the bit line precharge power supply wire VBP[0] are connected to each other electrically, and consequently, a current ib flows. The charge accumulation node CPND is charged to a high level, and the bit line precharge power supply wire VBP[0] is increased in level rapidly by the current ib.

In response to the increase in level, the operational amplifier 1607 changes the operation so as to turn off the P-channel transistor 1608. However, it takes a time for the current ia to decrease.

After the delay time τ2 determined by the second delay element 1702, the transfer gate connection signal AP is turned to be low, and the transfer gate connection signal NAP is turned to be high. The second P-channel transistor 1602 and the first N-channel transistor 1603 are turned off, and the first P-channel transistor 1601 is turned on. The charge accumulation node CPND is charged to a high level, and is provided for the subsequent precharge operation.

Herein, in order to perform a precharge operation at a high speed, it is necessary to accumulate a sufficient charge amount in the pumping capacitor 1600, and hence, a relatively large size is required for the pumping capacitor 1600.

In order to perform a subsequent reading operation stably, it is necessary to perform a precharge operation of the paired bit lines BL[n], /BL[n] within a predetermined period of time. In a conventional semiconductor memory device, it is necessary to perform a pumping operation using the pumping capacitor 1600 with a relatively large size, in order to perform a precharge operation within a predetermined period of time. This makes it difficult to reduce a chip area.

SUMMARY OF THE INVENTION

Therefore, with the foregoing in mind, it is an object of the present invention to provide a semiconductor memory device in which a precharge operation can be performed at a high speed even with a pumping capacitor having a relatively small size, and a chip area can be reduced.

A first semiconductor memory device according to the present invention includes: a plurality of memory cells; paired bit lines connected to the plurality of memory cells; a plurality of precharge circuits for precharging the paired bit lines to a predetermined precharge voltage (VBP) in accordance with a first control signal (NEQ); and a bit line precharge voltage generation unit for supplying a voltage for precharging to the plurality of precharge circuits. An equalizing voltage of the paired bit lines is different from the precharge voltage. The bit line precharge voltage generation unit includes: a precharge voltage generation circuit for generating the precharge voltage and supplying the precharge voltage to the plurality of precharge circuits; and a precharge voltage pumping circuit including a pumping capacitor, a first switch for connecting a first electrode of the pumping capacitor to a first power source (VDD), a second switch for connecting the first electrode to an output node of the precharge voltage generation circuit, a third switch for connecting a second electrode of the pumping capacitor to the first power source, a fourth switch for connecting the second electrode to a second power source (VSS), and a control circuit for controlling on/off of the first, second, third, and fourth switches.

According to the above-mentioned configuration, even if the size of the pumping capacitor is small, the precharge operation of a bit line can be performed at a high speed.

Furthermore, in the first semiconductor memory device, it is preferable that the first, second, third, and fourth switches and the pumping capacitor are composed of MOS transistors. Because of this, the bit line precharge voltage generation unit can be mounted on a MOS integrated circuit easily.

Furthermore, it is preferable that the first semiconductor memory device has a plurality of gate oxide film thicknesses, and the first, second, third, and fourth switches and the pumping capacitor are composed of MOS transistors with a thick gate oxide film thickness. Because of this, a circuit can be driven at a high voltage of a word line signal, a bit line precharge starting signal, and the like of a DRAM.

Furthermore, it is preferable that the first semiconductor memory device has a plurality of gate oxide film thicknesses, and the first, second, third, and fourth switches and the pumping capacitor are composed of MOS transistors with a thin gate oxide film thickness. Because of this, a transistor with a high driving ability at a low voltage and a pumping capacitor with a small area can be configured, resulting in a reduction in power consumption.

Furthermore, in the first semiconductor memory device, the control circuit of the precharge voltage pumping circuit controls the second switch and the third switch so as to turn them on during precharge or during a predetermined period of time from a commencement of precharge, and controls the first switch and the fourth switch so as to turn them on during the other period of time. Because of this, the charge in the pumping capacitor can be transferred to the paired bit lines to set the potential of the paired bit lines to a desired potential at a high speed.

A second semiconductor memory device according to the present invention includes: a plurality of memory cells; paired bit lines connected to the plurality of memory cells; a plurality of precharge circuits for precharging the paired bit lines to a predetermined precharge voltage (VBP) in accordance with a first control signal (NEQ); and a bit line precharge voltage generation unit for supplying a voltage for precharging to the plurality of precharge circuits. An equalizing voltage of the paired bit lines is different from the precharge voltage. The bit line precharge voltage generation unit includes: a precharge voltage generation circuit for generating the precharge voltage and supplying the precharge voltage to the plurality of precharge circuits; and a precharge voltage pumping circuit including a pumping capacitor, a first switch for connecting a first electrode of the pumping capacitor to a first power source (VDD), a second switch for connecting the first electrode to an output node of the precharge voltage generation circuit, and a control circuit for controlling on/off of the first and second switches, wherein a second electrode of the pumping capacitor is driven with a second control signal (EXCP).

According to the above configuration, in addition to the advantage of the first semiconductor memory device, the number of components can be reduced, and a chip area further can be reduced.

A third semiconductor memory device according to the present invention includes: a plurality of memory cells; paired bit lines connected to the plurality of memory cells; a plurality of precharge circuits for precharging the paired bit lines to a predetermined precharge voltage (VBP) in accordance with a first control signal (NEQ); and a bit line precharge voltage generation unit for supplying a voltage for precharging to the plurality of precharge circuits. An equalizing voltage of the paired bit lines is different from the precharge voltage. The bit line precharge voltage generation unit includes: a precharge voltage generation circuit for generating the precharge voltage and supplying the precharge voltage to the plurality of precharge circuits; and a precharge voltage pumping circuit including a pumping capacitor, a first switch for connecting a first electrode of the pumping capacitor to a first power source (VDD), a second switch for connecting the first electrode to an output node of the precharge voltage generation circuit, and a control circuit for controlling on/off of the first and second switches, wherein a second electrode of the pumping capacitor is driven with a second control signal. The second control signal rises during an activation period of a first control signal that is a bit line precharge starting signal to the precharge circuit.

According to the above-mentioned configuration and control, in addition to the advantage in terms of configuration of the second semiconductor memory device, the charge in the pumping capacitor can be transferred to the paired bit lines efficiently without applying an overvoltage to the first electrode of the pumping capacitor.

A fourth semiconductor memory device according to the present invention includes: a plurality of memory cells; paired bit lines connected to the plurality of memory cells; a plurality of precharge circuits for precharging the paired bit lines to a predetermined precharge voltage in accordance with a first control signal (NEQ); and a bit line precharge voltage generation unit for supplying a voltage for precharging to the plurality of precharge circuits. An equalizing voltage of the paired bit lines is different from the precharge voltage. The bit line precharge voltage generation unit includes: a precharge voltage generation circuit for generating the precharge voltage and supplying the precharge voltage to the plurality of precharge circuits; and a precharge voltage pumping circuit including a pumping capacitor, a first switch for connecting a first electrode of the pumping capacitor to a first power source (VDD), a second switch for connecting the first electrode to an output node of the precharge voltage generation circuit, a control circuit for controlling on/off of the first and second switches, and a precharge voltage pumping circuit for driving a second electrode of the pumping capacitor with a second control signal (EXCP). The second control signal rises with a transition time longer than a transition time of the first control signal, after a predetermined delay time from activation of the first control signal that is a bit line precharge starting signal to the precharge circuit.

According to the above-mentioned configuration and control, in addition to the advantage in terms of configuration of the second semiconductor memory device, the charge in the pumping capacitor can be transferred to the paired bit lines efficiently without applying an overvoltage to the first electrode of the pumping capacitor.

Furthermore, in the first to fourth semiconductor memory devices, the first control signal is a bit line precharge starting signal to the precharge circuit. Because of this, the charge in the pumping capacitor can be transferred to the paired bit lines to obtain a desired voltage during a precharge operation.

Furthermore, in the second semiconductor memory device, it is preferable that the first control signal also functions as the second control signal. Because of this, an area occupied by a control circuit, signal wiring, and the like required for controlling the second control signal can be reduced.

Furthermore, in the second to fourth semiconductor memory devices, it is preferable that the first and second switches and the pumping capacitor are composed of MOS transistors. Because of this, the bit line precharge voltage generation unit can be mounted on a MOS integrated circuit easily.

Furthermore, it is preferable that the second to fourth semiconductor memory devices have a plurality of gate oxide film thicknesses, and the first and second switches and the pumping capacitor are composed of MOS transistors with a thick gate oxide film thickness. Because of this, a circuit can be driven at a high voltage of a word line signal, a bit line precharge starting signal, and the like of a DRAM.

Furthermore, it is preferable that the second to fourth semiconductor memory devices have a plurality of gate oxide film thicknesses, and the first and second switches and the pumping capacitor are composed of MOS transistors with a thin gate oxide film thickness. Because of this, a transistor with a high driving ability at a low voltage and a pumping capacitor with a small area can be configured, resulting in a reduction in power consumption.

Furthermore, in the second to fourth semiconductor memory devices, the control circuit of the precharge voltage pumping circuit controls the second switch and the third switch so as to turn them on with the first control signal during precharge or during a predetermined period of time from a commencement of precharge, and is operated so that charge in the pumping capacitor is transferred to an output node of the precharge voltage generation circuit with the second control signal. Because of this, the charge in the pumping capacitor can be transferred to the paired bit lines to set a bit line precharge voltage to a desired potential at a high speed.

Furthermore, it is preferable that the first to fourth semiconductor memory devices have a first well region of an N-channel MOS transistor and a second well region of a P-channel MOS transistor, and a MOS transistor constituting the pumping capacitor is a transistor in the second well region. Because of this, the pumping capacitor can be composed of a P-channel MOS transistor.

Furthermore, it is preferable that the first to fourth semiconductor memory devices have a triple-well region including a first well region of an N-channel MOS transistor, a second well region of a P-channel MOS transistor, and a third well region of an N-channel MOS transistor, and a MOS transistor constituting the pumping capacitor is a transistor in the third well region. Because of this, the pumping capacitor can be composed of an N-channel MOS transistor in a triple-well.

Furthermore, in the first to fourth semiconductor memory devices, it is preferable that the first electrode of the pumping capacitor is composed of a gate electrode of a MOS transistor, and the second electrode is composed of a source, a drain, and a substrate of a MOS transistor connected to each other. Because of this, the charge in the pumping capacitor can be transferred to the paired bit lines to set the potential of the paired bit lines to a desired potential at a high speed.

Furthermore, in the first to fourth semiconductor memory devices, it is preferable that the first electrode of the pumping capacitor is composed of a source, a drain, and a substrate of a MOS transistor connected to each other, and the second electrode is composed of a gate electrode of a MOS transistor. Because of this, the pumping capacitor can be composed of a P-channel MOS transistor, and the charge in the pumping capacitor can be transferred to the paired bit lines to set the potential of the paired bit lines to a desired potential at a high speed.

Furthermore, in the first to fourth semiconductor memory devices, it is preferable that the pumping capacitor uses a plurality of wiring layers in the semiconductor memory device as electrodes, and is composed of a capacitance formed between the wiring layers. Because of this, the capacitor can be obtained stably without being influenced by depletion of an electric field.

Furthermore, in the first to fourth semiconductor memory devices, it is preferable that the plurality of memory cells are formed in a plurality of memory cell array blocks capable of being activated individually, and the precharge voltage pumping circuit is placed so as to be paired with each of the memory cell array blocks. Because of this, a precharge operation can be performed individually on the memory cell array block basis, which makes it unnecessary to change the ability of the bit line precharge voltage generation unit in accordance with the macro-capacitance of a DRAM.

Furthermore, in the first to fourth semiconductor memory devices, it is preferable that the plurality of memory cells are formed in a plurality of memory cell array blocks capable of being activated individually, and the precharge voltage pumping circuit is placed so as to be paired with each of the memory cell array blocks and is operated in accordance with a transition from a non-precharged state to a precharged state of each of the memory cell array blocks. Because of this, the pumping operation of a precharge voltage can be performed in accordance with a bit line precharge operation on the memory cell array block basis, which makes it unnecessary to change the ability of the bit line precharge voltage generation unit in accordance with the macro-capacitance of a DRAM.

Furthermore, in the first to fourth semiconductor memory devices, it is preferable that the plurality of memory cells are formed in a plurality of memory cell array blocks capable of being activated individually, and the precharge voltage pumping circuit is placed so as to be paired with each of the memory cell array blocks and is operated based on a bit line precharge starting signal to the precharge circuit in the memory cell array block. Because of this, the pumping operation of a precharge voltage can be performed with a bit line precharge starting signal on the memory cell array block basis, which makes it unnecessary to change the ability of the bit line precharge voltage generation unit in accordance with the macro-capacitance of a DRAM.

Furthermore, in the first to fourth semiconductor memory devices, it is preferable that the bit line precharge voltage generation unit is placed on one side of the memory cell array block so as to be in parallel with a sense amplifier string. Because of this, control signal lines required for generating a bit line precharge voltage can be placed in parallel with sense amplifier strings, so that an area required for arranging the control signal lines can be reduced.

Furthermore, in the first to fourth semiconductor memory devices, it is preferable that the bit line precharge voltage generation unit is placed on one side of the memory cell array block so as to be adjacent to the precharge circuit string. Because of this, the precharge voltage can be transferred efficiently from the bit line precharge voltage generation unit to the precharge circuit string.

Furthermore, in the first to fourth semiconductor memory devices, it is preferable that the bit line precharge voltage generation unit is placed on one side of the memory cell array block so as to be placed in a row decoder block or so as to be in parallel with a row decoder string. Because of this, a control signal required for generating a bit line precharge voltage can be transferred efficiently to the bit line precharge voltage generation unit, and the bit line precharge voltage can be supplied to the precharge circuit string efficiently through power supply wiring placed in parallel with a precharge circuit string, resulting in a reduction in an area occupied by power supply wiring and the like.

Furthermore, in the first to fourth semiconductor memory devices, it is preferable that the bit line precharge voltage generation unit is placed on one side of the memory cell array block so as to be opposed to a row decoder block with the memory cell array block interposed therebetween. Because of this, a bit line precharge voltage can be supplied efficiently to a precharge circuit string through power supply wiring placed in parallel with the precharge circuit string, which enables an area occupied by the power supply wiring and the like to be reduced.

Furthermore, in the first to fourth semiconductor memory devices, it is preferable that a voltage amplitude of the second control signal is substantially the same as a voltage amplitude of a word line connected to the plurality of memory cells.

Furthermore, in order to achieve the above-mentioned object, the present invention is directed to a semiconductor memory device with one of the second to fourth semiconductor memory devices and a logic circuit device therein. A voltage amplitude of a second control signal is substantially the same as that of a signal in the logic circuit device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of preferred embodiments with reference to the drawings.

Embodiment 1

Figure 1:
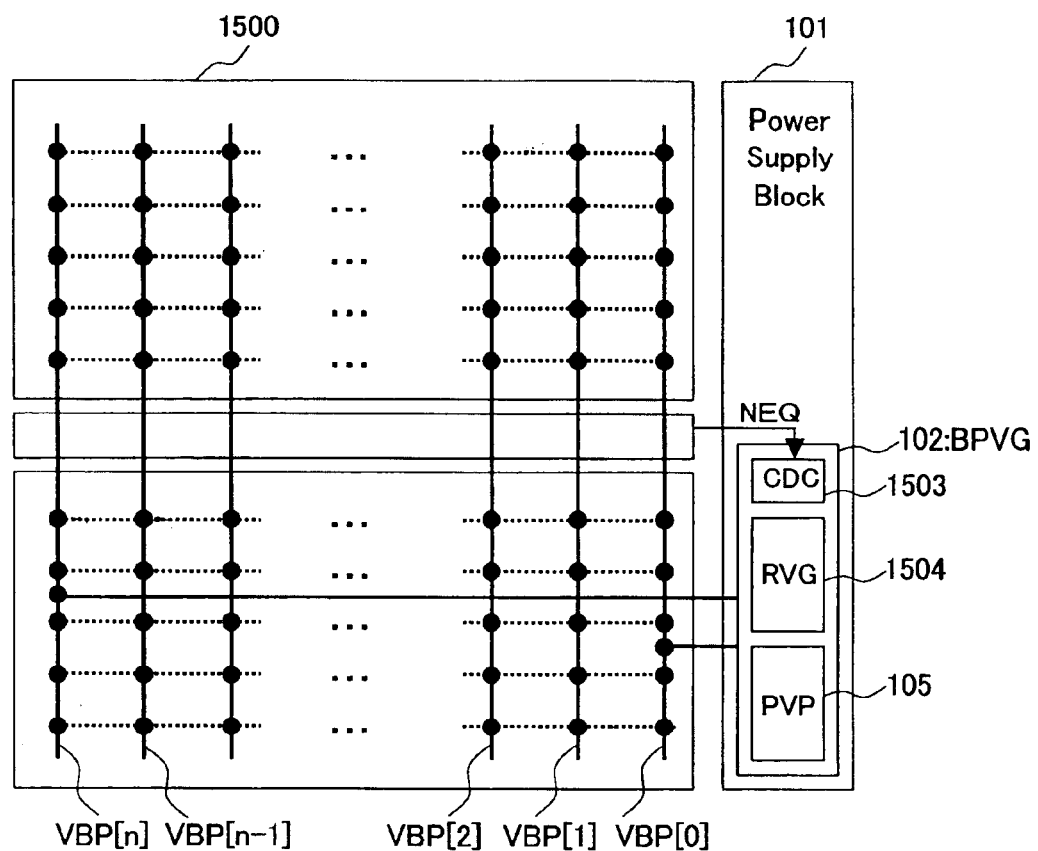
FIG. 1 is a schematic view showing a circuit block and a power supply wiring net of a bit line precharge voltage VBP in a semiconductor memory device according to Embodiment 1 of the present invention.
Figure 15:
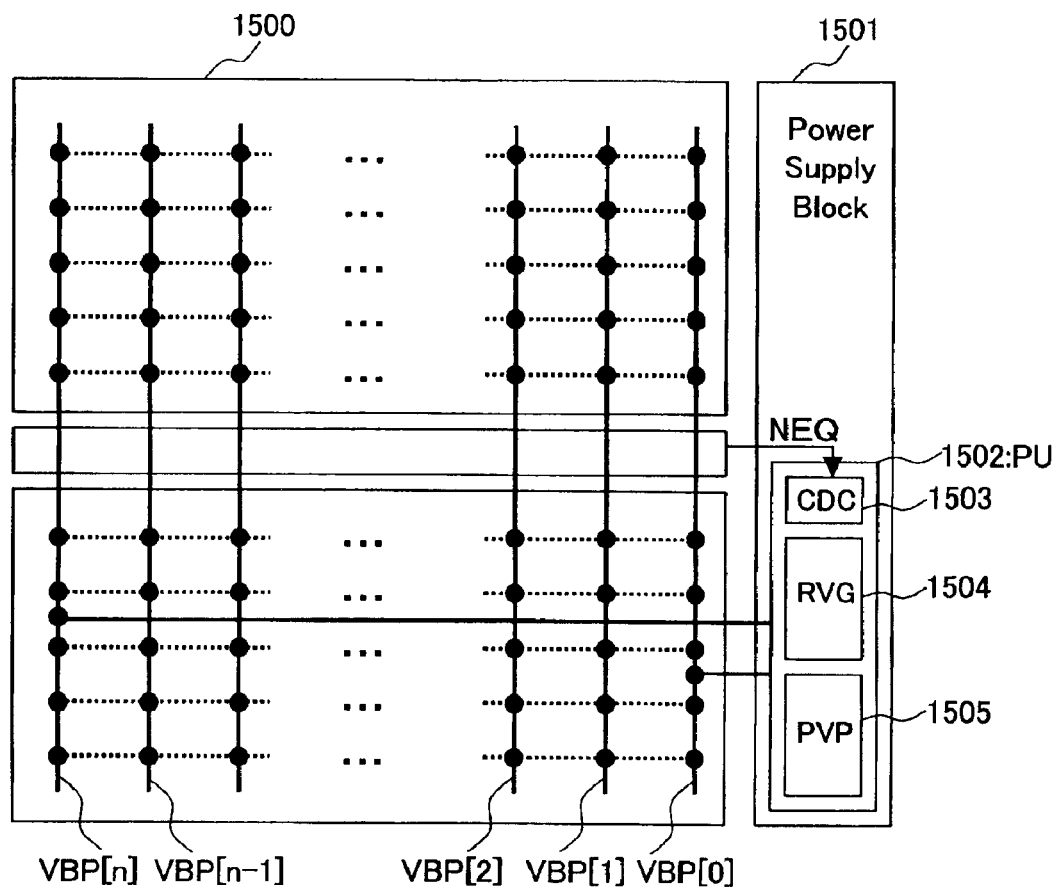
FIG. 15 is a schematic diagram of a circuit block and a power supply wiring net of a bit line precharge voltage VBP in a conventional semiconductor memory device.
Figure 16:
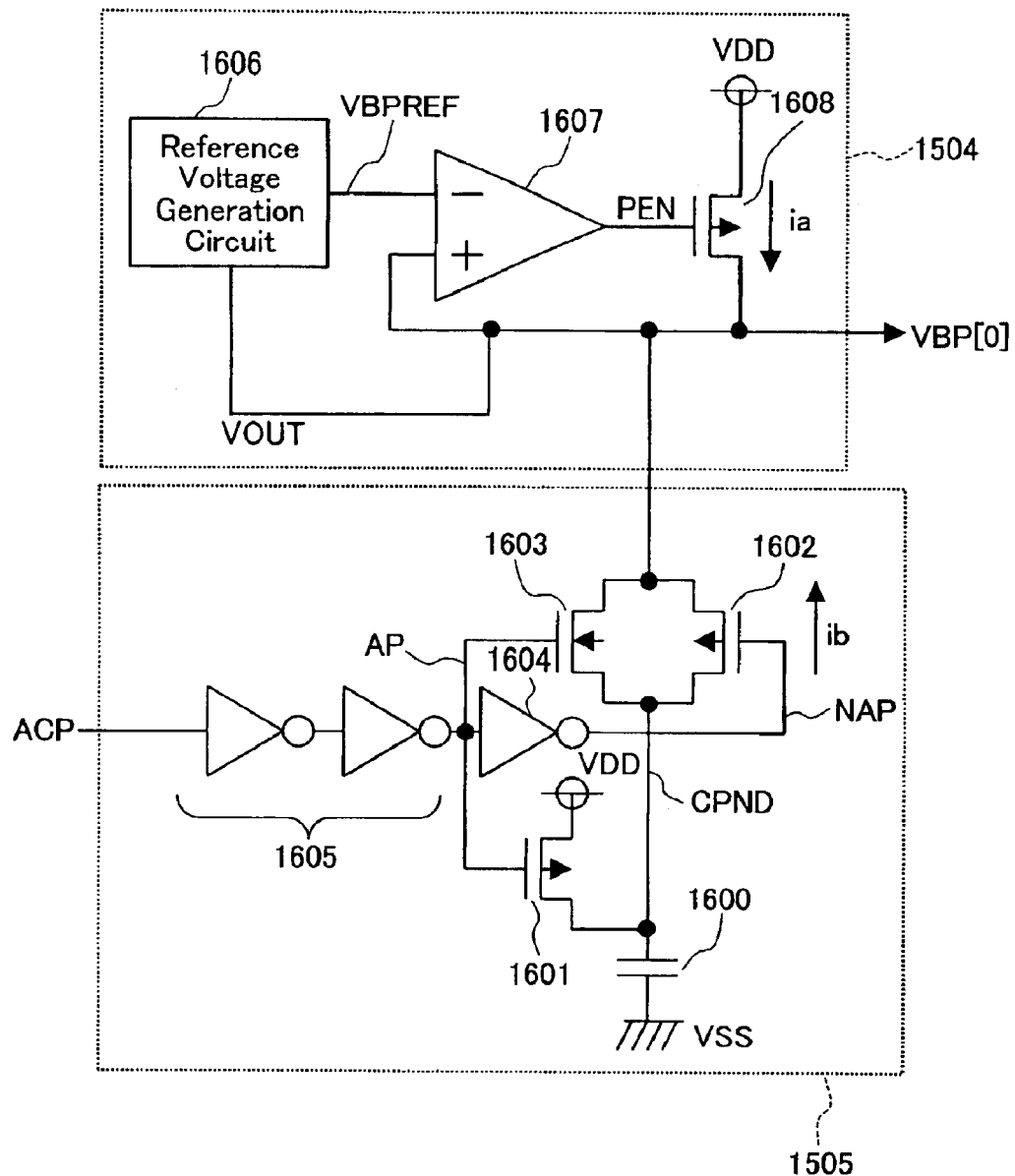
FIG. 16 is a circuit diagram showing internal configurations of a bit line precharge voltage generation circuit 1504 and a precharge voltage pumping circuit 1505 shown in FIG. 15.
Figure 17:
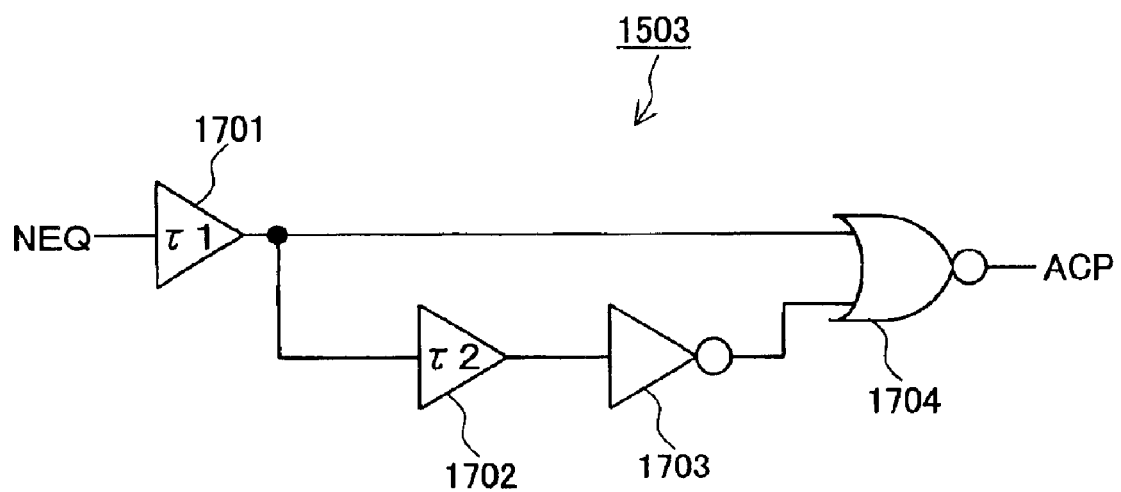
FIG. 17 is a circuit diagram showing an internal configuration of a charging/discharging control circuit shown in FIG. 15.
Figure 18:
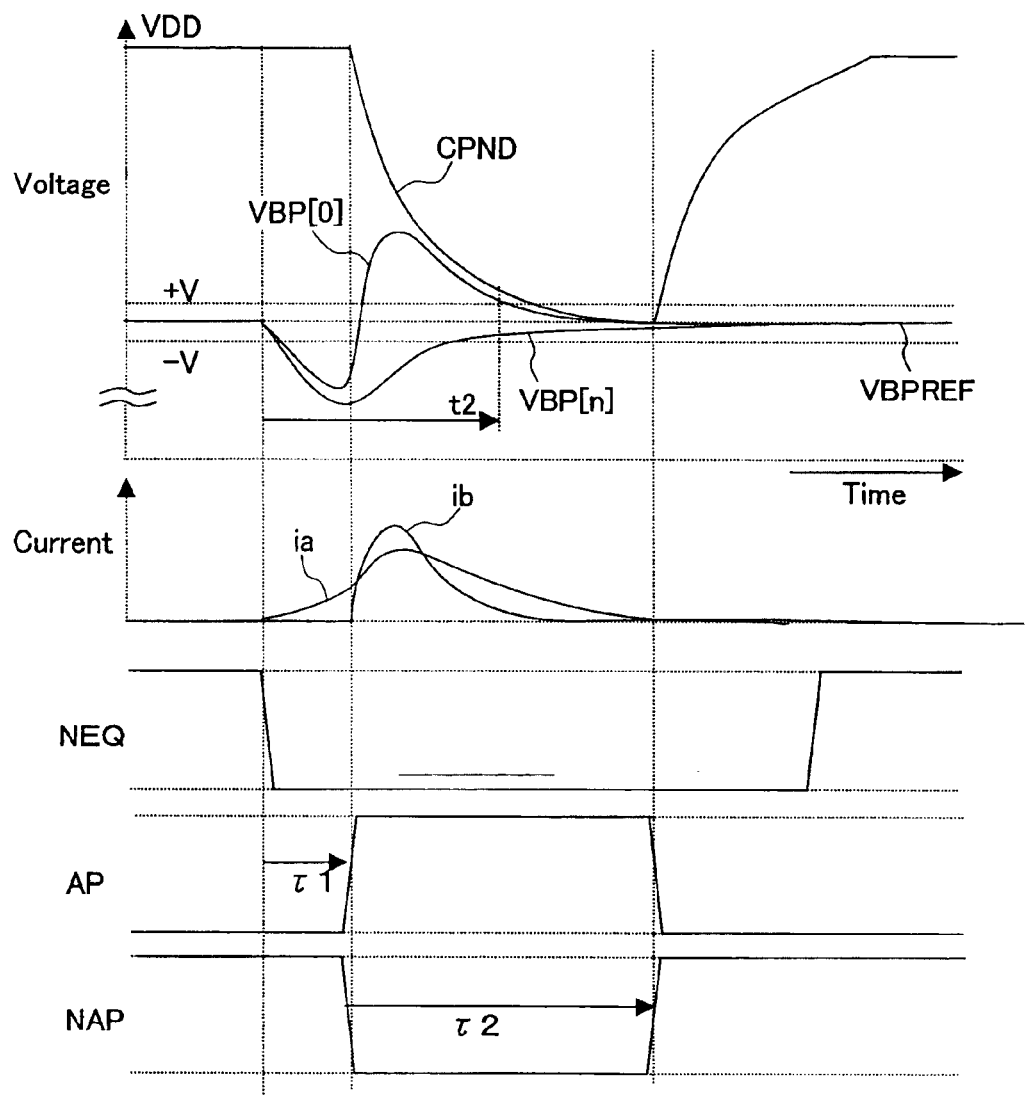
FIG. 18 is a timing chart showing a voltage and a current of a signal in each portion during precharge operation of a bit line in the conventional semiconductor memory device.

FIG. 1 is a schematic view showing a circuit block and a power supply wiring net of a bit line precharge voltage VBP in a semiconductor memory device according to Embodiment 1 of the present invention. In FIG. 1, components having the same configurations and functions as those described in the conventional example with reference to FIG. 15 are denoted with the same reference numerals as those therein, and the description thereof will be omitted here. Furthermore, the functional block configuration of a DRAM circuit, the circuit configuration of a memory cell array block 1302, the power supply wiring net of a bit line precharge voltage VBP in a memory cell array 1500, and the circuit configuration of a charging/discharging control circuit 1503 are the same as those in the conventional example shown in FIGS. 13, 14, 15, and 17.

The present embodiment differs from the conventional example in the configuration of a precharge voltage pumping circuit (PVP) 105 in a bit line precharge voltage generation unit (BPVG) 102 contained in a power supply block 101.

The bit line precharge voltage generation unit 102 is connected to a bit line precharge power supply wire VBP[0] positioned closest to the bit line precharge voltage generation unit 102 and a bit line precharge power supply wire VBP[n] positioned farthest from the bit line precharge voltage generation unit 102, among the bit line precharge power supply wires VBP[0] to VBP[n].

Figure 2:
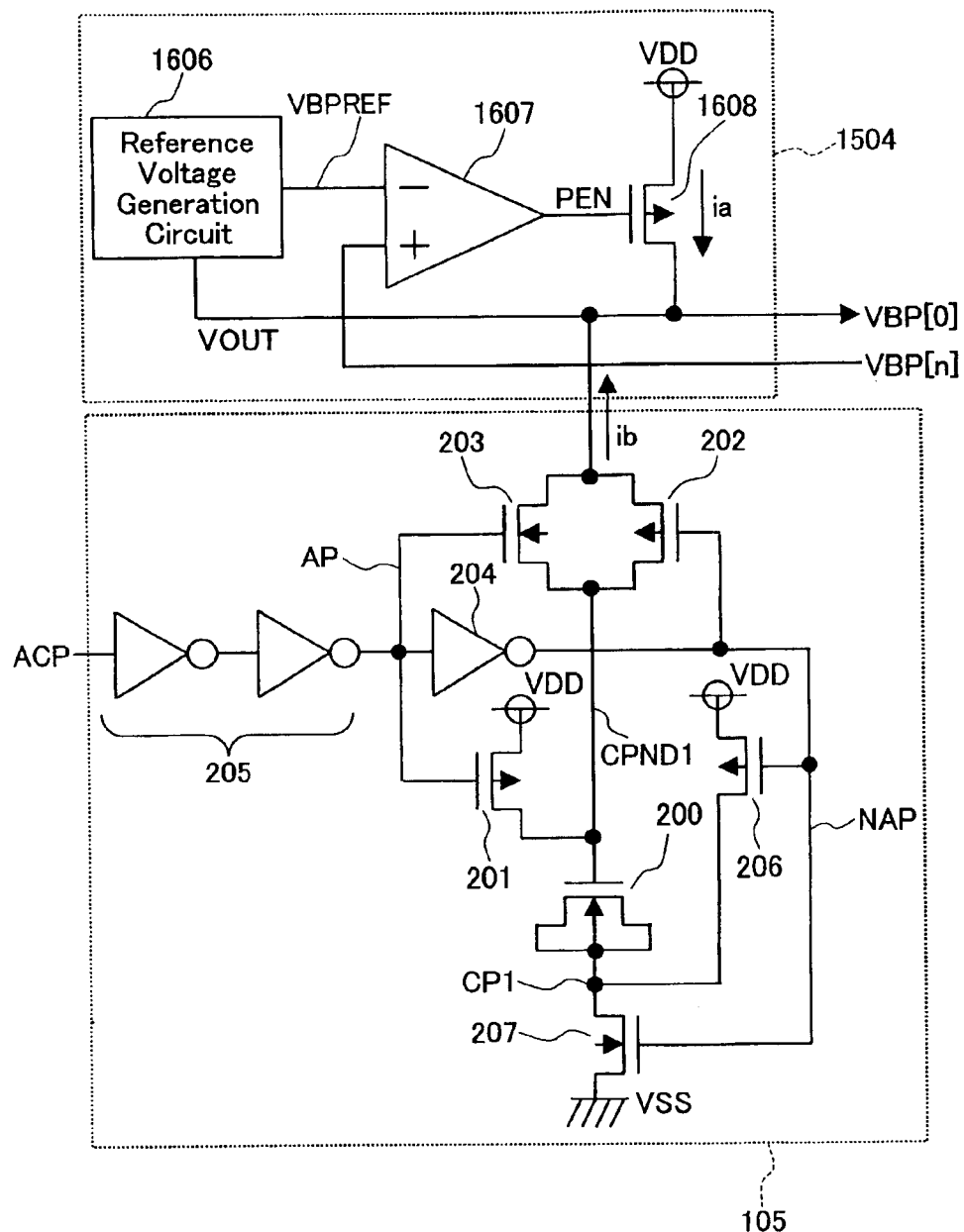
FIG. 2 is a circuit diagram showing internal configurations of a bit line precharge voltage generation circuit 1504 and a precharge voltage pumping circuit 105 shown in FIG. 1.

FIG. 2 is a circuit diagram showing internal configurations of the bit line precharge voltage generation circuit 1504 and the precharge voltage pumping circuit 105 shown in FIG. 1. In FIG. 2, the precharge voltage pumping circuit 105 is composed of a pumping capacitor 200, a first P-channel transistor 201 (first switch), a second P-channel transistor 202 (second switch), a first N-channel transistor 203 (second switch), an inverter 204 (control circuit), a buffer inverter 205 (control circuit), a third P-channel transistor 206 (third switch), and a second N-channel transistor 207 (fourth switch). CPND1 denotes a first charge accumulation node; CP1 denotes a second charge accumulation node; and AP, NAP, and ACP denote transfer gate connection signals. The configuration of the bit line precharge voltage generation circuit 1504 is the same as that of the conventional example.

A first electrode of the pumping capacitor 200 is connected to drains of the first P-channel transistor 201, the second P-channel transistor 202, and the first N-channel transistor 203. A second electrode of the pumping capacitor 200 is connected to the second charge accumulation node CP1 to which drains of the third P-channel transistor 206 and the second N-channel transistor 207 are connected. A capacitance Ccap of the pumping capacitor 200 is required to accumulate (VBPREF−½ VDD)×Cbl, which is equal to charge required for charging the potential of paired bit lines BL[n], /BL[n] to the bit line precharge reference voltage VBPREF, assuming that the total capacitance of the paired bit lines BL[n], /BL[n] to be simultaneously precharged is Cbl. During operation, considering the charge supplied from the operational amplifier 1607, the pumping capacitor 200 having the capacitance Ccap satisfying the relationship: Ccap<(VBPREF−½ VDD)/(VDD−VBPREF)×Cbl is used.

A gate of the first P-channel transistor 201 is supplied with the transfer gate connection signal AP, and a source thereof is supplied with a supply voltage VDD. A gate of the second P-channel transistor 202 is supplied with the transfer gate connection signal NAP, and a source thereof is connected to the bit line precharge power supply wire VBP[0]. A gate of the first N-channel transistor 203 is supplied with the transfer gate connection signal AP, and a source thereof is connected to the bit line precharge power supply wire VBP[0]. The inverter 204 receives the transfer gate connection signal AP, and outputs the transfer gate connection signal NAP. The buffer inverter 205 is composed of inverters in even-number stages connected in series. The buffer inverter 205 receives the transfer gate connection signal ACP, and outputs the transfer gate connection signal AP. A gate of the third P-channel transistor 206 is supplied with the transfer gate connection signal NAP, and a source thereof is supplied with the supply voltage VDD. A gate of the second N-channel transistor 207 is supplied with the transfer gate connection signal NAP, and a source thereof is connected to a ground potential VSS.

Figure 7:
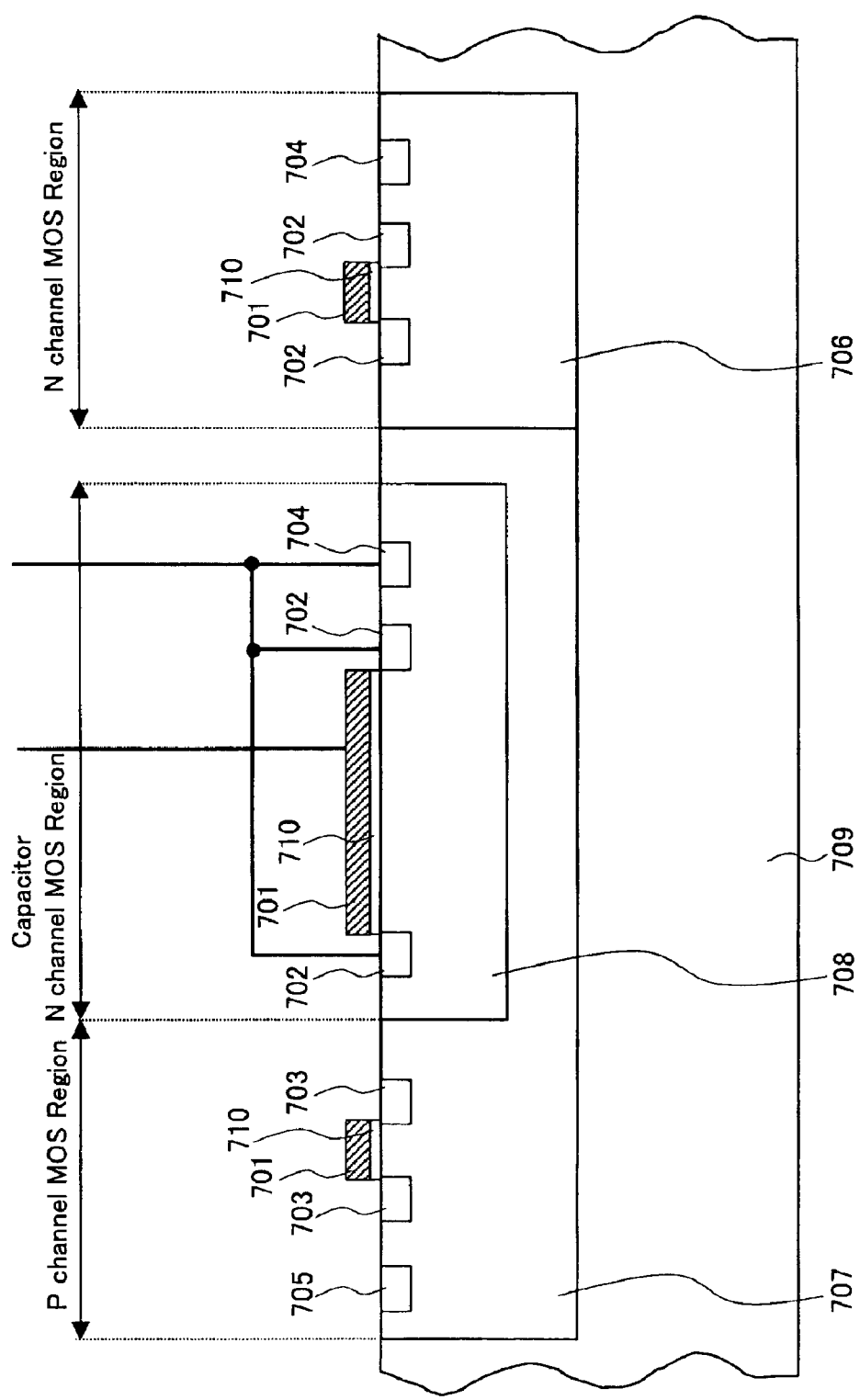
FIG. 7 is a cross-sectional view showing a semiconductor configuration of a MOS transistor used in Embodiments 1 and 2 of the present invention.

FIG. 7 is a cross-sectional view showing a semiconductor configuration of a MOS transistor used in the present embodiment. Reference numeral 701 denotes a gate electrode. 702 denotes source and drain electrodes in an N-channel MOS region. 703 denotes source and drain electrodes in a P-channel MOS region. 704 denotes a substrate contact in the N-channel MOS region. 705 denotes a substrate contact in the P-channel MOS region. 706 denotes a first well region of the N-channel MOS transistor. 707 denotes a second well region of the P-channel MOS transistor. 708 denotes a third well region of the N-channel MOS transistor. 709 denotes a P-type semiconductor substrate, and 710 denotes a gate oxide film.

Next, the operation during precharge of a bit line in the semiconductor memory device thus configured will be described with reference to FIG. 3.

Figure 3:
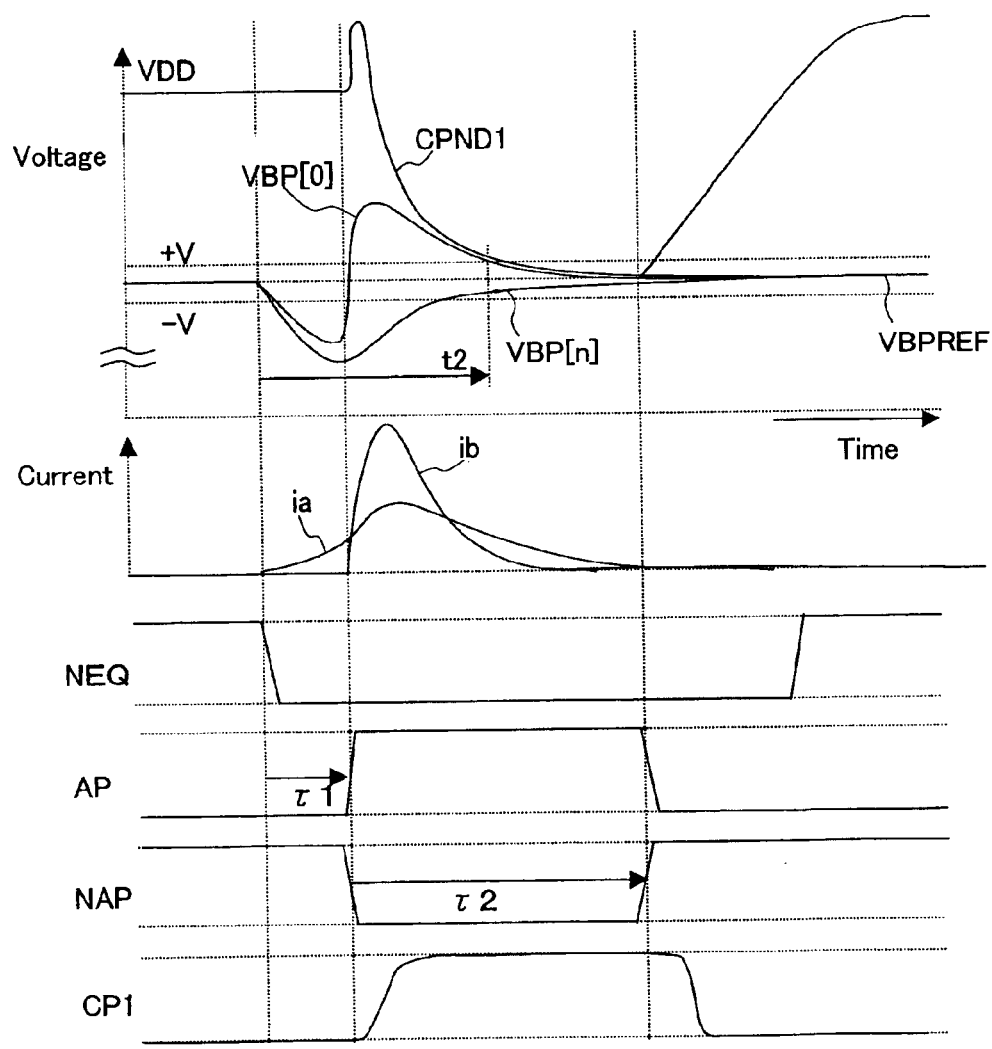
FIG. 3 is a timing chart showing a voltage and a current of a signal in each portion during precharge operation of a bit line in the semiconductor memory device according to Embodiment 1 of the present invention.

FIG. 3 is a timing chart showing a voltage and a current of a signal in each portion in FIGS. 1, 2, 14, and 17.

When the bit line precharge starting signal NEQ (first control signal) is lowered to activate the bit line precharge circuit 1402, the potentials of the paired bit lines BL[n], /BL[n] set to be VDD and VSS, respectively, by the sense amplifier 1401 are equalized and attempted to be charged to the potential of ½ VDD. Simultaneously, the bit line precharge circuit 1402 connects the paired bit lines BL[n], /BL[n] to the bit line precharge power supply wire VBP[n], and attempts to charge them to the bit line precharge voltage VBP. At this time, a current is consumed, and a voltage drop occurs.

When the voltage drop occurs in the bit line precharge power supply wire VBP[n], the voltage drop is transmitted to the bit line precharge power supply wire VBP[0] through the wires connected in a mesh shape.

Upon detecting the voltage drop of the bit line precharge power supply wire VBP[n], the operational amplifier 1607 in the bit line precharge voltage generation circuit 1504 is activated. However, it takes a time for a current ia from the P-channel transistor 1608 to increase.

In the case where the bit line precharge starting signal NEQ is at a high level, the transfer gate connection signal AP is at a low level, whereas the transfer gate connection signal NAP is at a high level. The second P-channel transistor 202, the first N-channel transistor 203, and the third P-channel transistor 206 are in an OFF state, and the first P-channel transistor 201 and the second N-channel transistor 207 are in an ON state. The first charge accumulation node CPND1 is charged to a high level, and the second charge accumulation node CP1 is connected to the ground potential VSS via the second N-channel transistor 207.

Next, when the bit line precharge starting signal NEQ is lowered, after the delay time τ1 determined by the first delay element 1701 in the charging/discharging control circuit 1503, the transfer gate connection signal AP is turned to be high, and the transfer gate connection signal NAP is turned to be low. The first P-channel transistor 201 and the second N-channel transistor 207 are turned off, and the second P-channel transistor 202, the third P-channel transistor 206, and the first N-channel transistor 203 are turned on. Because of this, the voltage of the second charge accumulation node CP1 is stepped up, and the first charge accumulation node CPND1 is stepped up instantaneously. The first charge accumulation node CPND1 and the bit line precharge power supply wire VBP[0] are connected to each other electrically, and consequently, a current ib flows. The bit line precharge power supply wire VBP[0] is increased in level rapidly by the current ib.

In response to the increase in level, the operational amplifier 1607 changes the operation so as to turn off the P-channel transistor 1608. However, it takes a time for the current ia to decrease.

After the delay time τ2 determined by the second delay element 1702 in the charging/discharging control circuit 1503, the transfer gate connection signal AP is turned to be low, and the transfer gate connection signal NAP is turned to be high. The second P-channel transistor 202, the first N-channel transistor 203, and the third P-channel transistor 206 are turned off, and the first P-channel transistor 201 and the second N-channel transistor 207 are turned on. The first charge accumulation node CPND1 is again charged to a supply voltage VDD, which is provided for the subsequent precharge operation.

As described above, according to the present embodiment, when the paired bit lines BL[n], /BL[n] are precharged, the charge accumulated in the pumping capacitor 200 is discharged so as to compensate for the delay in operation of the operational amplifier 1607. In addition to this function, in order to increase the speed of a precharge operation and reduce the size of the pumping capacitor 200, by connecting the second electrode of the pumping capacitor 200 to the supply voltage VDD or the ground potential VSS via the third P-channel transistor 206 and the second N-channel transistor 207, the precharge operation can be performed within a predetermined period of time, and the capacitance area of the pumping capacitor 200 can be reduced. Consequently, a layout area on a chip can be reduced.

Furthermore, the first P-channel transistor 201, the second P-channel transistor 202, the first N-channel transistor 203, the third P-channel transistor 206, the second N-channel transistor 207, and the pumping capacitor 200 for controlling a precharge operation are composed of MOS transistors, whereby the bit line precharge voltage generation circuit of the present embodiment can be mounted easily on a MOS integrated circuit.

Furthermore, the first P-channel transistor 201, the second P-channel transistor 202, the first N-channel transistor 203, the third P-channel transistor 206, the second N-channel transistor 207, and the pumping capacitor 200 for controlling a precharge operation are composed of thick-film MOS transistors, whereby the bit line precharge circuit of the present embodiment can be driven at a high voltage.

Furthermore, in the present embodiment, the first P-channel transistor 201, the second P-channel transistor 202, the first N-channel transistor 203, the third P-channel transistor 206, the second N-channel transistor 207, and the pumping capacitor 200 also can be composed of thin-film MOS transistors. In this case, the bit line precharge circuit of the present embodiment can be composed of transistors having a high driving ability at a low voltage and capacitors with a small area, resulting in a decrease in power consumption in the circuit.

Furthermore, in the present embodiment, the same effect also can be obtained in the following manner. The pumping capacitor 200 is composed of a transistor in the second well region 707 of the P-channel MOS transistor, among the first well region 706 of the N-channel MOS transistor and the second well region 707 of the P-channel MOS transistor shown in FIG. 7. The gate electrode (first electrode) of the pumping capacitor 200 is connected to the drains of the third P-channel transistor 206 and the second N-channel transistor 207. The source and drain electrodes (second electrode) of the pumping capacitor 200 are connected to the drains of the first P-channel transistor 201, the second P-channel transistor 202, and the first N-channel transistor 203. Thus, the pumping capacitor 200 is composed of a P-channel transistor.

Furthermore, in the present embodiment, the same effect also can be obtained in the following manner. The pumping capacitor 200 is composed of a transistor in the third well region 708 of the N-channel MOS transistor, among a triple well region including the first well region 706 of the N-channel MOS transistor, the second well region 707 of the P-channel MOS transistor, and the third well region 708 of the N-channel MOS transistor shown in FIG. 7. Thus, the pumping capacitor 200 is composed of an N-channel transistor in a triple well.

Furthermore, in the present embodiment, it also is possible that a plurality of wiring layers are used as electrodes, and the pumping capacitor 200 is composed of a capacitor made of capacitance formed between the wiring layers. This enables a stable capacitor to be obtained, without being influenced by the depletion of an electric field.

Embodiment 2

Figure 4:
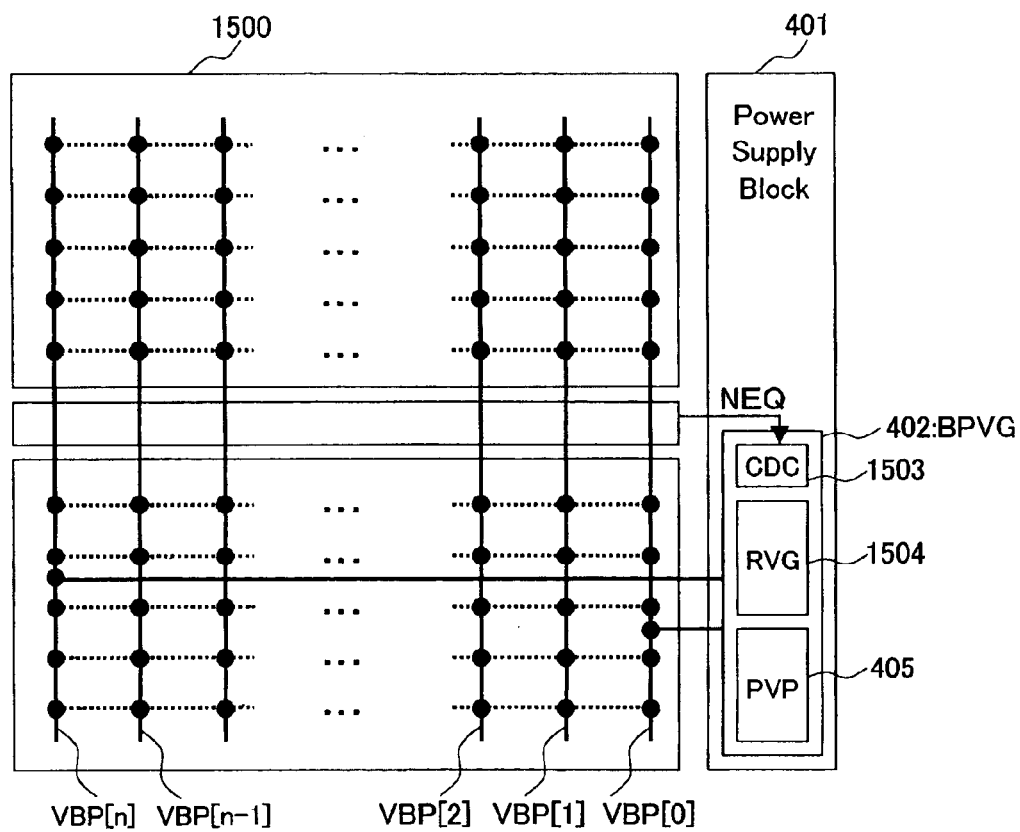
FIG. 4 is a schematic view showing a circuit block and a power supply wiring net of a bit line precharge voltage VBP in a semiconductor memory device according to Embodiment 2 of the present invention.

FIG. 4 is a schematic view showing a power supply wiring net of a bit line precharge voltage VBP in a semiconductor memory device according to Embodiment 2 of the present invention. In FIG. 4, components having the same configurations and functions as those described in the conventional example and Embodiment 1 with reference to FIGS. 15 and 1 are denoted with the same reference numerals as those therein, and the description thereof will be omitted here. Furthermore, the functional block configuration of a DRAM circuit, the circuit configuration of a memory cell array block 1302, the power supply wiring net of a bit line precharge voltage VBP in a memory cell array 1500, and the circuit configuration of a charging/discharging control circuit 1503 are the same as those in the conventional example shown in FIGS. 13, 14, 15, and 17.

The present embodiment differs from Embodiment 1 in the configuration of a precharge voltage pumping circuit 405 in a bit line precharge voltage generation unit 402 contained in a power supply block 401.

Figure 5:
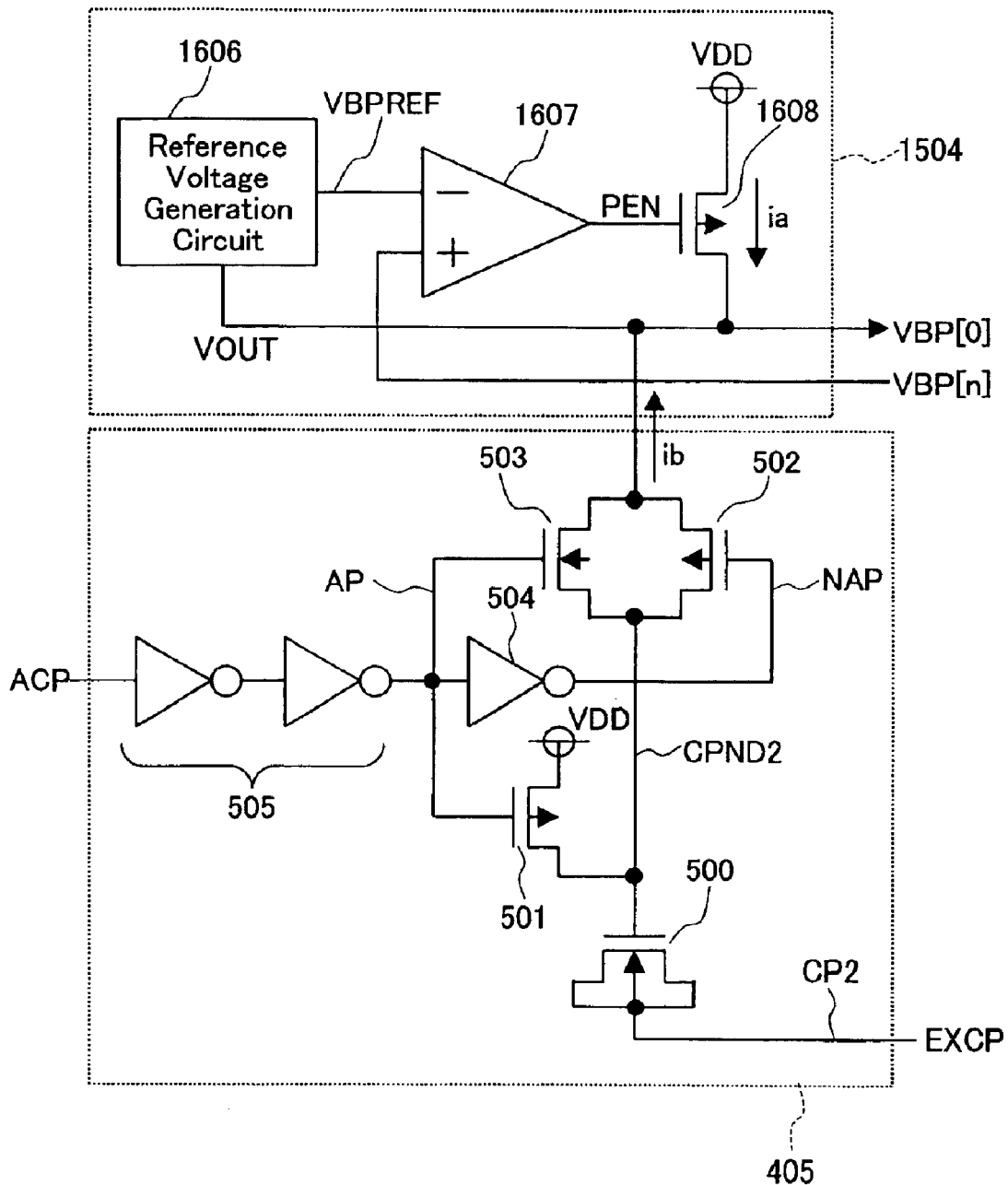
FIG. 5 is a circuit diagram showing internal configurations of a bit line precharge voltage generation circuit 1504 and a precharge voltage pumping circuit 405 shown in FIG. 4.

FIG. 5 is a circuit diagram showing internal configurations of the bit line precharge voltage generation circuit 1504 and the precharge voltage pumping circuit 405 shown in FIG. 4. In FIG. 5, the precharge voltage pumping circuit 405 is composed of a pumping capacitor 500, a first P-channel transistor 501 (first switch), a second P-channel transistor 502 (second switch), an N-channel transistor 503 (second switch), an inverter 504 (control circuit), and a buffer inverter 505 (control circuit). CPND2 denotes a first charge accumulation node; CP2 denotes a second charge accumulation node; AP, NAP, and ACP denote transfer gate connection signals; and EXCP denotes a second control signal.

A first electrode of the pumping capacitor 500 is connected to drains of the first P-channel transistor 501, the second P-channel transistor 502, and the N-channel transistor 503. A second electrode of the pumping capacitor 500 is supplied with the second control signal EXCP having a voltage amplitude similar to that of a word line connected to the memory cell array 1500. A capacitance Ccap of the pumping capacitor 500 is required to accumulate (VBPREF−½ VDD)×Cbl, which is equal to the charge required for charging the potential of paired bit lines BL[n], /BL[n] to the bit line precharge reference voltage VBPREF, assuming that the total capacitance of the paired bit lines BL[n], /BL[n] to be simultaneously precharged is Cbl. During operation, considering charge supplied from the operational amplifier 1607, the pumping capacitor 500 having the capacitance Ccap satisfying the relationship: Ccap< (VBPREF−½ VDD)/(VDD−VBPREF)×Cbl is used.

A gate of the first P-channel transistor 501 is supplied with the transfer gate connection signal AP, and a source thereof is supplied with a supply voltage VDD. A gate of the second P-channel transistor 502 is supplied with the transfer gate connection signal NAP, and a source thereof is connected to the bit line precharge power supply wire VBP[0]. A gate of the N-channel transistor 503 is supplied with the transfer gate connection signal AP, and a source thereof is connected to the bit line precharge power supply wire VBP[0]. The inverter 504 receives the transfer gate connection signal AP, and outputs the transfer gate connection signal NAP. The buffer inverter 505 is composed of inverters in even-number stages connected in series. The buffer inverter 505 receives the transfer gate connection signal ACP, and outputs the transfer gate connection signal AP.

The MOS transistor configuration in the present embodiment is the same as that shown in FIG. 7 described in Embodiment 1.

Next, the operation during precharge of a bit line in the semiconductor memory device thus configured will be described with reference to FIG. 6.

Figure 6:
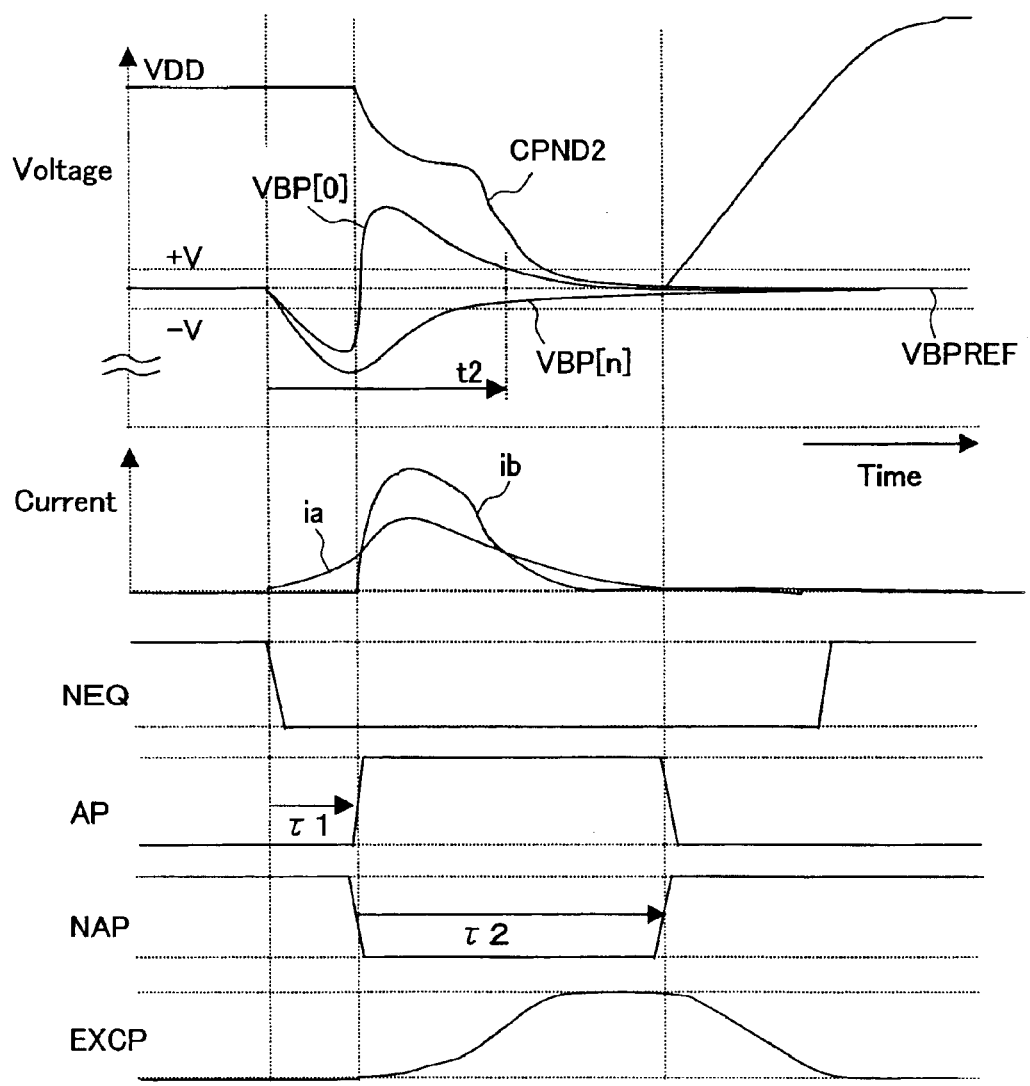
FIG. 6 is a timing chart showing a voltage and a current of a signal in each portion during precharge operation of a bit line in the semiconductor memory device according to Embodiment 2 of the present invention.

FIG. 6 is a timing chart showing a voltage and a current of a signal in each portion in FIGS. 4, 5, 14, and 17.

When the bit line precharge starting signal NEQ is lowered to activate the bit line precharge circuit 1402, the potentials of the paired bit lines BL[n], /BL[n] set to be VDD and VSS, respectively, by the sense amplifier 1401 are equalized and attempted to be charged to the potential of ½ VDD. Simultaneously, the bit line precharge circuit 1402 connects the paired bit lines BL[n], /BL[n] to the bit line precharge power supply wire VBP[n], and attempts to charge them to the bit line precharge voltage VBP. At this time, a current is consumed, and a voltage drop occurs.

When the voltage drop occurs in the bit line precharge power supply wire VBP[n], the voltage drop is transmitted to the bit line precharge power supply wire VBP[0] through the wires connected in a mesh shape.

Upon detecting the voltage drop of the bit line precharge power supply wire VBP[n], the operational amplifier 1607 in the bit line precharge voltage generation circuit 1504 is activated. However, it takes a time for a current ia from the P-channel transistor 1608 to increase.

In the case where the bit line precharge starting signal NEQ is at a high level, the transfer gate connection signal AP is at a low level, whereas the transfer gate connection signal NAP is at a high level. The second P-channel transistor 502 and the N-channel transistor 503 are in an OFF state, and the first P-channel transistor 501 is in an ON state. The second control signal EXCP is set to be the ground potential VSS. The first charge accumulation node CPND2 is charged to the supply voltage VDD, and the second charge accumulation node CP2 is connected to the ground potential VSS.

Next, when the bit line precharge starting signal NEQ is lowered, after the delay time τ1 determined by the first delay element 1701 in the charging/discharging control circuit 1503, the transfer gate connection signal AP is turned to be high, and the transfer gate connection signal NAP is turned to be low. The first P-channel transistor 501 is turned off, and the second P-channel transistor 502 and the N-channel transistor 503 are turned on.

At this time, by controlling the second control signal EXCP so as to step it up gently compared with a rising time of the transfer gate connection signal AP, the second charge accumulation node CP2 is stepped up gently, and the first charge accumulation node CPND2 is stepped up from the supply voltage VDD without being supplied with an overvoltage.

Furthermore, the first charge accumulation node CPND2 and the bit line precharge power supply wire VBP[0] are connected to each other electrically, and consequently, a current ib flows. The bit line precharge power supply wire VBP[0] is increased in level rapidly by the current ib. Furthermore, at this time, the second control signal EXCP is stepped up gently compared with a rising time of the transfer gate control signal AP. Therefore, the charge of the pumping capacitor 500 can be transferred to a bit line without allowing the first electrode of the pumping capacitor 500 to be supplied with an overvoltage.

In response to the increase in level of the bit line precharge power supply wire VBP[0], the operational amplifier 1607 changes the operation so as to turn off the P-channel transistor 1608. However, it takes a time for the current ia to decrease.

After the delay time τ2 determined by the second delay element 1702 in the charging/discharging control circuit 1503, the transfer gate connection signal AP is turned to be low, and the transfer gate connection signal NAP is turned to be high. The second P-channel transistor 502 and the N-channel transistor 503 are turned off, and the first P-channel transistor 501 is turned on. By lowering the second control signal EXCP to the ground potential VSS gently compared with a falling time of the transfer gate control signal AP, the first charge accumulation node CPND2 is again charged to the supply voltage VDD, and is provided for the subsequent precharge operation.

As described above, according to the present embodiment, when the paired bit lines BL[n], /BL[n] are precharged, the charge accumulated in the pumping capacitor 500 is discharged so as to compensate for the delay in operation of the operational amplifier 1607. In addition to this function, in order to increase the speed of a precharge operation and reduce the size of the pumping capacitor 500, by applying the second control signal EXCP to the second electrode of the pumping capacitor 500, and controlling the second control signal EXCP from the supply voltage VDD to the ground potential VSS, the precharge operation can be performed within a predetermined period of time, and the capacitance area of the pumping capacitor 500 can be reduced. Consequently, a layout area on a chip can be reduced.

Furthermore, the first P-channel transistor 501, the second P-channel transistor 502, the N-channel transistor 503, and the pumping capacitor 500 for controlling a precharge operation are composed of MOS transistors, whereby the bit line precharge voltage generation circuit of the present embodiment can be mounted easily on a MOS integrated circuit.

Furthermore, the first P-channel transistor 501, the second P-channel transistor 502, the N-channel transistor 503, and the pumping capacitor 500 for controlling a precharge operation are composed of thick-film MOS transistors, whereby the bit line precharge circuit of the present embodiment can be driven at a high voltage.

Furthermore, in the present embodiment, the first P-channel transistor 501, the second P-channel transistor 502, the N-channel transistor 503, and the pumping capacitor 500 also can be composed of thin-film MOS transistors. In this case, the bit line precharge circuit of the present embodiment can be composed of transistors having a high driving ability at a low voltage and capacitors with a small area, resulting in a decrease in power consumption in the circuit.

Furthermore, in the present embodiment, the same effect also can be obtained in the following manner. The pumping capacitor 500 is composed of a transistor in the second well region 707 of the P-channel MOS transistor, among the first well region 706 of the N-channel MOS transistor and the second well region 707 of the P-channel MOS transistor shown in FIG. 7. The gate electrode of the pumping capacitor 500 is supplied with the second control signal EXCP. The source and drain electrodes of the pumping capacitor 500 are connected to the drains of the first P-channel transistor 501, the second P-channel transistor 502, and the N-channel transistor 503. Thus, the pumping capacitor 500 is composed of a P-channel transistor.

Furthermore, in the present embodiment, the same effect also can be obtained in the following manner. The pumping capacitor 500 is composed of a transistor in the third well region 708 of the N-channel MOS transistor, among a triple well region including the first well region 706 of the N-channel MOS transistor, the second well region 707 of the P-channel MOS transistor, and the third well region 708 of the N-channel MOS transistor shown in FIG. 7. Thus, the pumping capacitor 500 is composed of an N-channel transistor in a triple well.

Furthermore, in the present embodiment, it also is possible that a plurality of wiring layers are used as electrodes, and the pumping capacitor 500 is composed of a capacitor made of capacitance formed between the wiring layers. This enables a stable capacitor to be obtained, without being influenced by the depletion of an electric field.

In the present embodiment, the transfer gate connection signal ACP also can be used as the second control signal EXCP. Because of this, areas occupied by a circuit, wiring and the like for controlling the second control signal EXCP can be reduced.

Furthermore, in the case where a semiconductor device is configured with the semiconductor memory device and logic circuit device according to the present embodiment therein, the second control signal EXCP can have a voltage amplitude substantially similar to that of a signal used in the logic circuit device.

Embodiment 3

Figure 8:
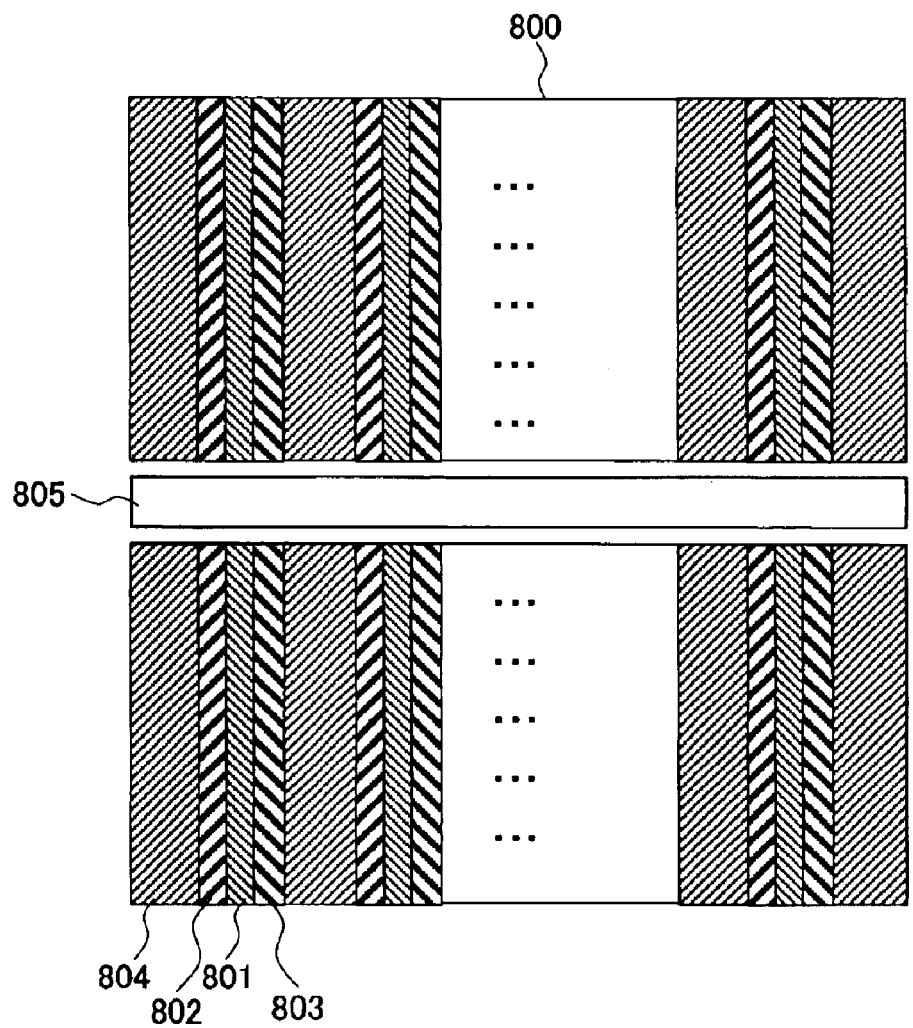
FIG. 8 is a schematic view showing a layout configuration of a DRAM functional block in a semiconductor memory device according to Embodiment 3 of the present invention.

FIG. 8 is a schematic view showing a layout configuration of a DRAM functional block in a semiconductor memory device according to Embodiment 3 of the present invention. In FIG. 8, reference numeral 800 denotes a DRAM functional block, 801 denotes bit line precharge voltage generation units in Embodiment 1 or 2, 802 denotes sense amplifier strings, 803 denotes precharge circuit strings, 804 denotes memory cell array blocks, and 805 denotes a row decoder.

In the present embodiment, in the DRAM functional block 800 having a plurality of memory cell array blocks 804, the bit line precharge voltage generation units 801 in Embodiment 1 or 2 are placed so as to be paired with the respective memory cell array blocks 804. Because of this, the pumping operation of a bit line precharge voltage is performed with a bit line precharge starting signal NEQ for each memory cell array block 804, whereby the precharge operation can be performed on the basis of memory cell arrays, which makes it unnecessary to vary the ability of the bit line precharge voltage generation unit 801, depending upon the level of the DRAM macro-capacitance.

Embodiment 4

Figure 9:
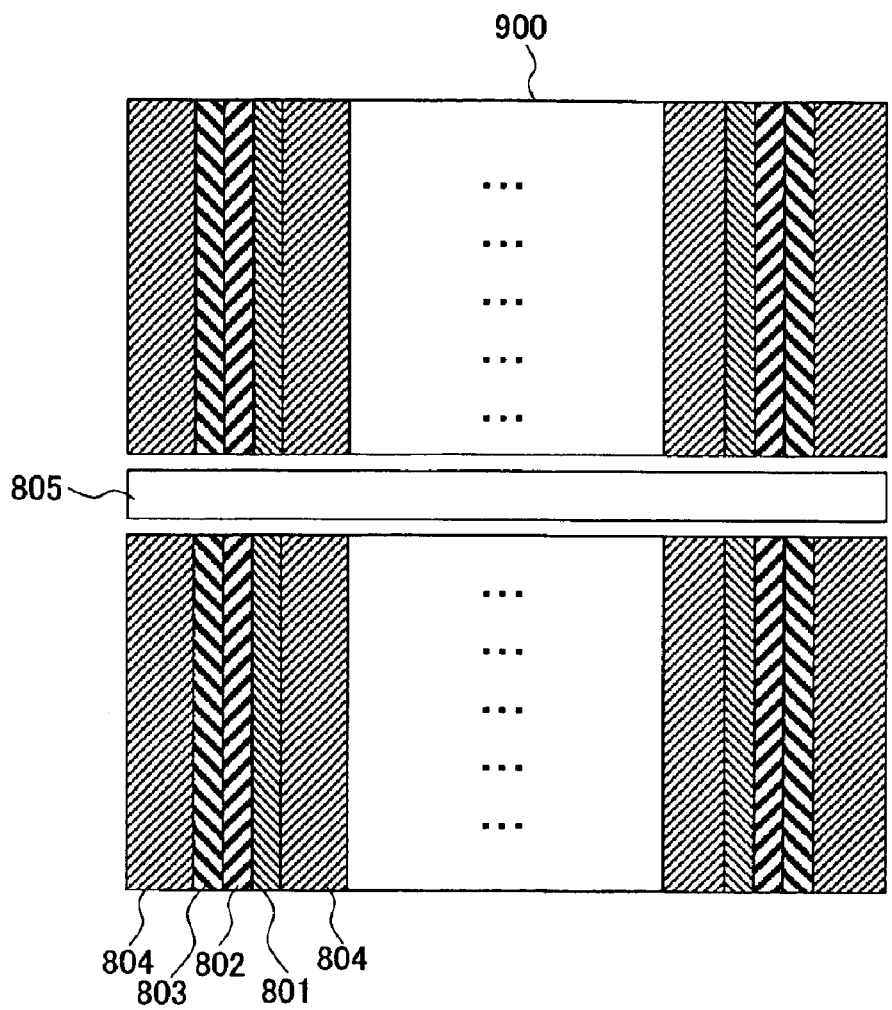
FIG. 9 is a schematic view showing a layout configuration of a DRAM functional block in a semiconductor memory device according to Embodiment 4 of the present invention.

FIG. 9 is a schematic view showing a layout configuration of a DRAM functional block in a semiconductor memory device according to Embodiment 4 of the present invention. In FIG. 9, components having the same functions as those in Embodiment 3 are denoted with the same reference numerals as those therein, and the description thereof will be omitted here.

The present embodiment differs from Embodiment 3 in the arrangement of the bit line precharge voltage generation units 801, the sense amplifier strings 802, the precharge circuit strings 803, and the memory cell array blocks 804 in a DRAM functional block 900.

In the present embodiment, in the DRAM functional block 900 having a plurality of memory cell arrays, the bit line precharge voltage generation units 801 are placed on one side of the respective memory cell array blocks 804 so as to be in parallel with the sense amplifier strings 802. This enables control signal lines required for generating a bit line precharge voltage to be placed in parallel with the sense amplifier strings 802. Therefore, an area required for placing control signal lines can be reduced.

Embodiment 5

Figure 10:
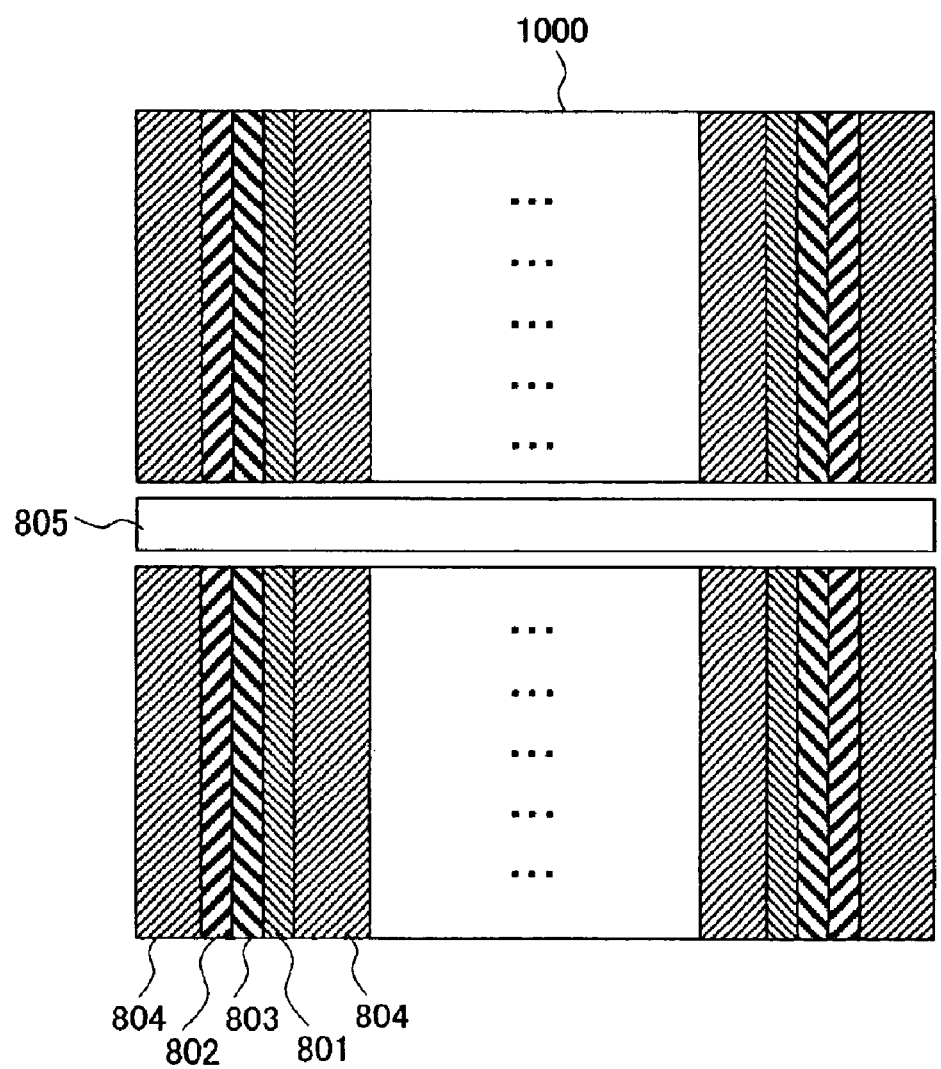
FIG. 10 is a schematic view showing a layout configuration of a DRAM functional block in a semiconductor memory device according to Embodiment 5 of the present invention.

FIG. 10 is a schematic view showing a layout configuration of a DRAM functional block in a semiconductor memory device according to Embodiment 5 of the present invention. In FIG. 10, components having the same functions as those in Embodiments 3 and 4 are denoted with the same reference numerals as those therein, and the description thereof will be omitted here.

The present embodiment differs from Embodiments 3 and 4 in the arrangement of the bit line precharge voltage generation units 801, the sense amplifier strings 802, the precharge circuit strings 803, and the memory cell array blocks 804 in a DRAM functional block 1000.

In the present embodiment, in the DRAM functional block 1000 having a plurality of memory cell arrays, the bit line precharge voltage generation units 801 are placed on one side of the respective memory cell array blocks 804 so as to be adjacent to the precharge circuit strings 803. This enables a precharge voltage to be transferred efficiently from the bit line precharge voltage generation units 801 to the precharge circuit strings 803.

Embodiment 6

Figure 11:
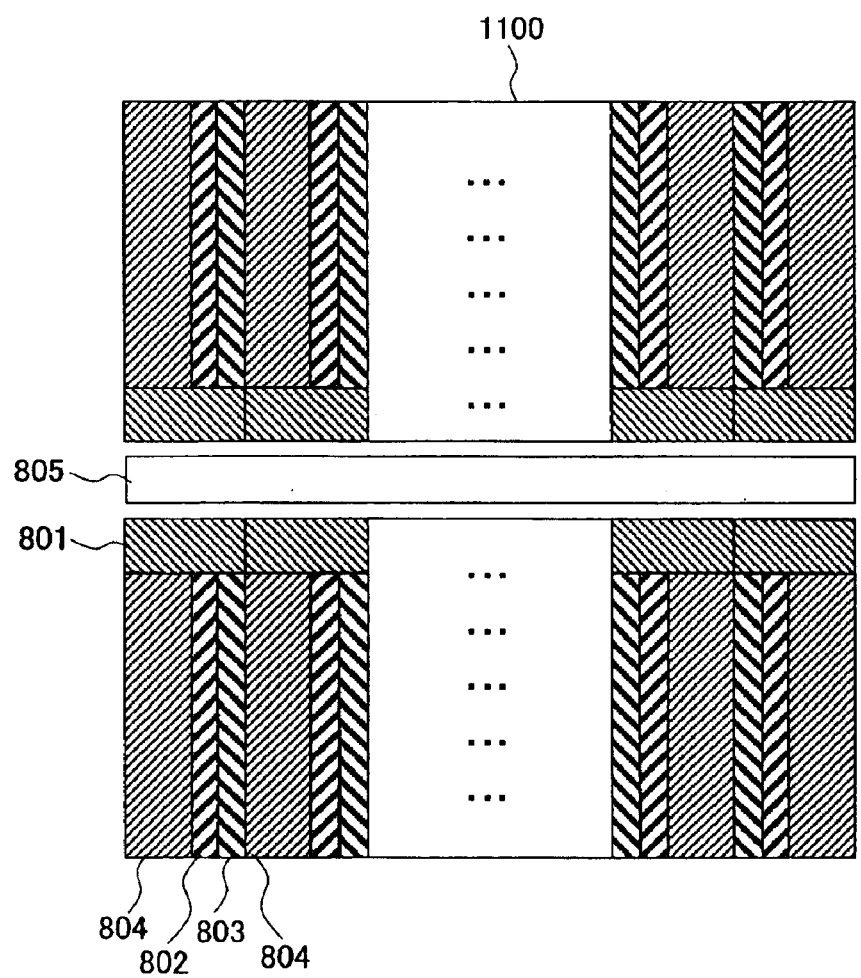
FIG. 11 is a schematic view showing a layout configuration of a DRAM functional block in a semiconductor memory device according to Embodiment 6 of the present invention.

FIG. 11 is a schematic view showing a layout configuration of a DRAM functional block in a semiconductor memory device according to Embodiment 6 of the present invention. In FIG. 11, components having the same functions as those in Embodiments 3 to 5 are denoted with the same reference numerals as those therein, and the description thereof will be omitted here.

The present embodiment differs from Embodiments 3 to 5 in the arrangement of the bit line precharge voltage generation units 801, the sense amplifier strings 802, the precharge circuit strings 803, and the memory cell array blocks 804 in a DRAM functional block 1100.

In the present embodiment, in the DRAM functional block 1100 having a plurality of memory cell arrays, the bit line precharge voltage generation units 801 are placed on one side of the respective memory cell array blocks 804 so as to be adjacent to the row decoder 805. This enables a control signal required for generating a bit line precharge voltage to be transferred efficiently to the bit line precharge voltage generation unit 801. Furthermore, by supplying a bit line precharge voltage to the precharge circuit strings 803 by power supply wiring placed in parallel with the precharge circuit strings 803, an area occupied by the power supply wiring and the like can be reduced.

Embodiment 7

Figure 12:
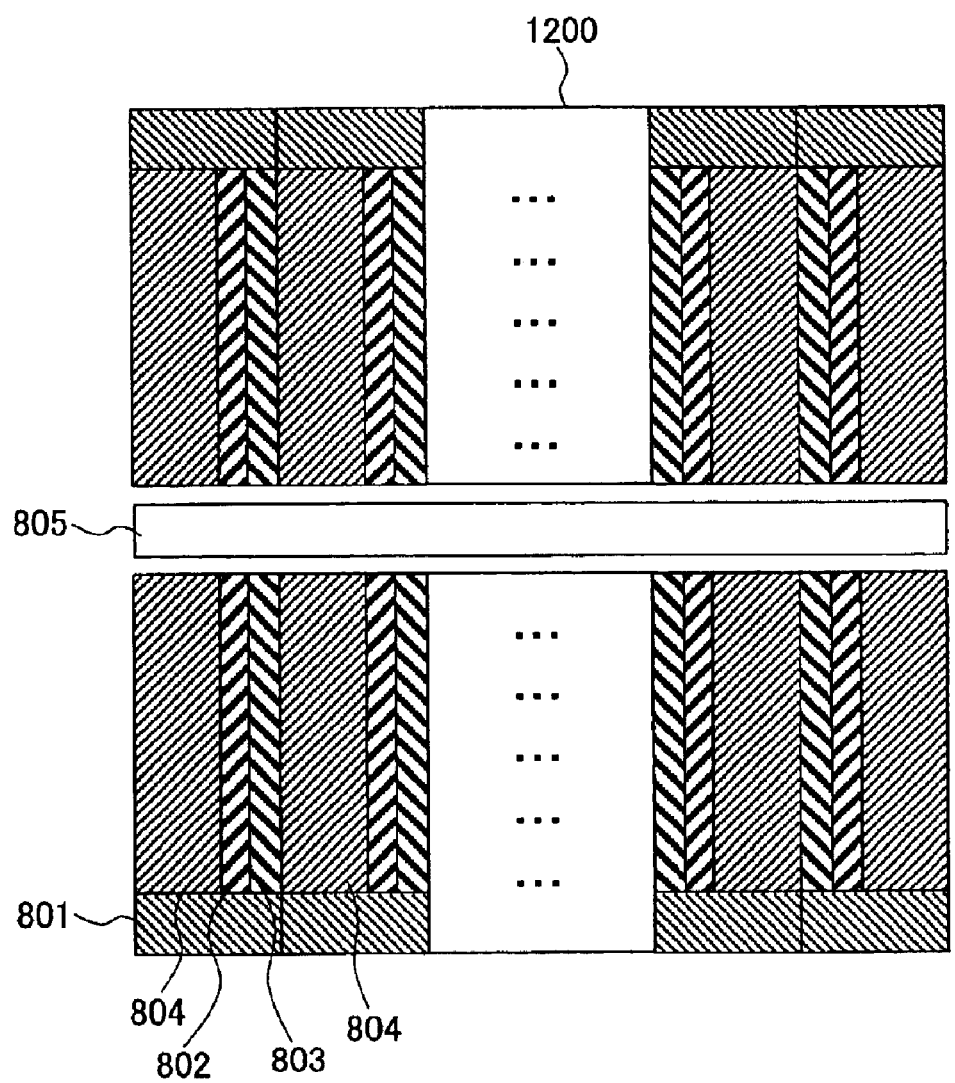
FIG. 12 is a schematic view showing a layout configuration of a DRAM functional block in a semiconductor memory device according to Embodiment 7 of the present invention.
Figure 13:
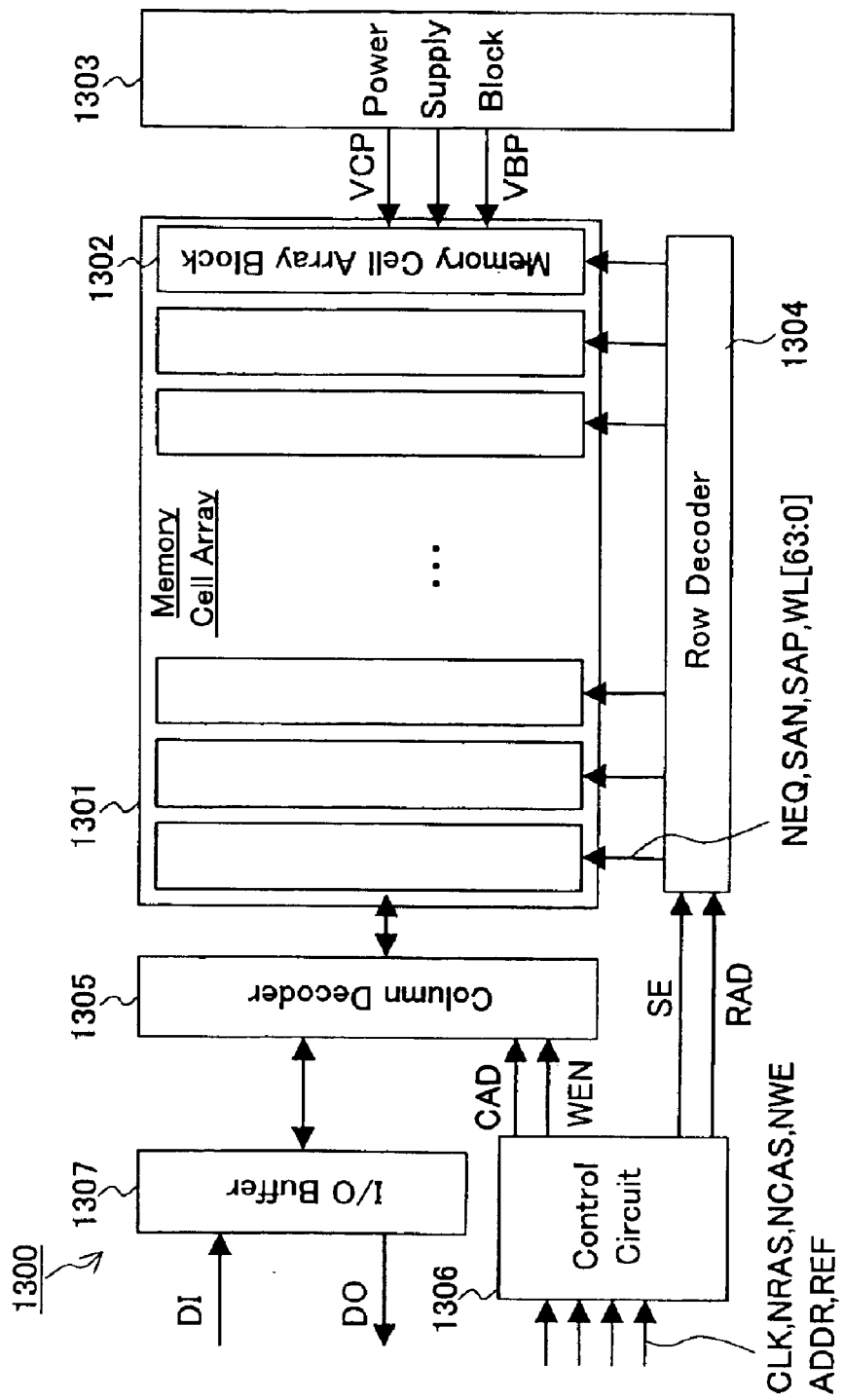
FIG. 13 is a functional block diagram showing a configuration of a general DRAM 1300.
Figure 14:
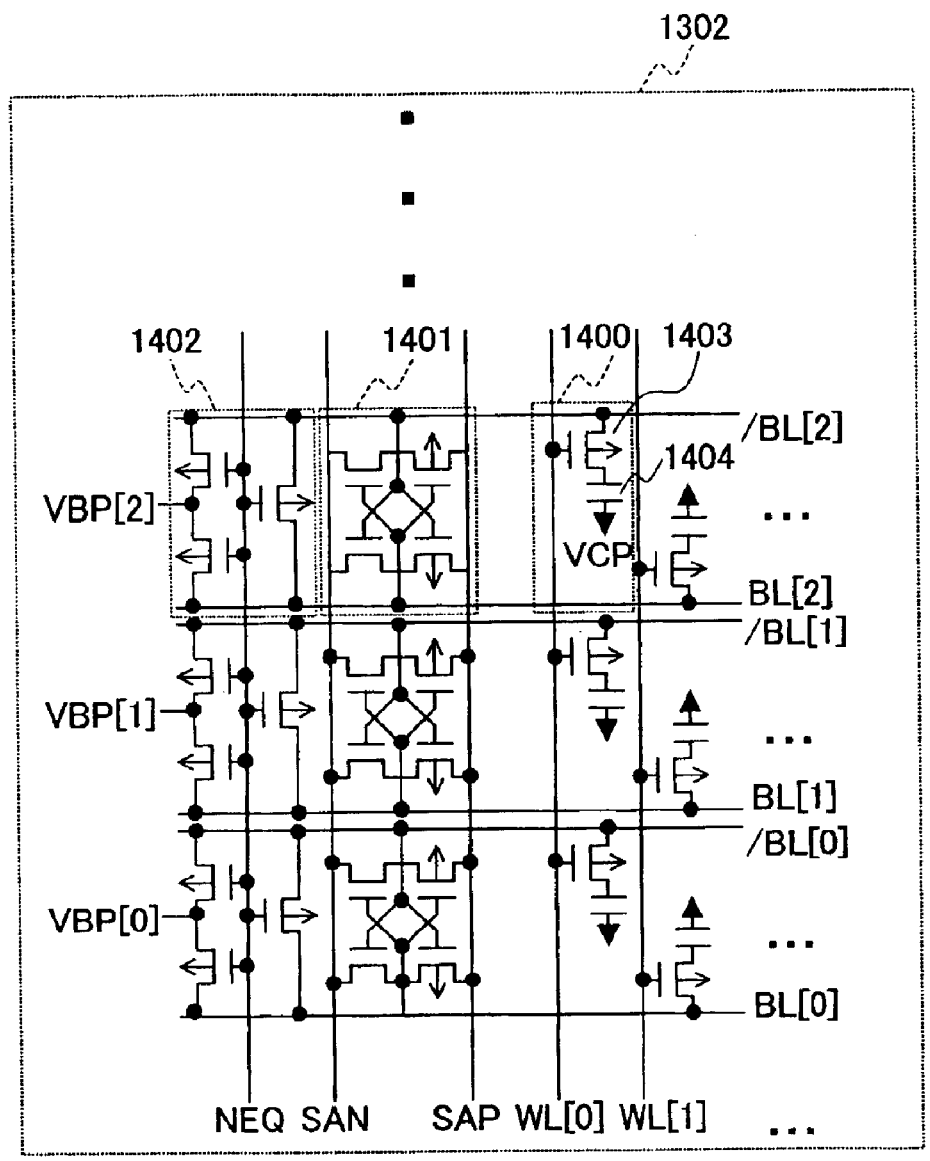
FIG. 14 is a circuit diagram of a memory cell array block 1302 shown in FIG. 13.

FIG. 12 is a schematic view showing a layout configuration of a DRAM functional block in a semiconductor memory device according to Embodiment 7 of the present invention. In FIG. 12, components having the same functions as those in Embodiments 3 to 6 are denoted with the same reference numerals as those therein, and the description thereof will be omitted here.

The present embodiment differs from Embodiments 3 to 6 in the arrangement of the bit line precharge voltage generation units 801, the sense amplifier strings 802, the precharge circuit strings 803, and the memory cell array blocks 804 in a DRAM functional block 1200.

In the present embodiment, in the DRAM functional block 1200 having a plurality of memory cell arrays, the bit line precharge voltage generation units 801 are placed on one side of the respective memory cell array blocks 804 so as to be opposed to the row decoder 805 with the memory cell array blocks 804 interposed therebetween. According to this configuration, by supplying a bit line precharge voltage to the precharge circuit strings 803 via power supply wiring placed in parallel with the precharge circuit strings 803, an area occupied by the power supply wiring and the like can be reduced.

As described above, according to the present invention, in a precharge voltage pumping circuit of a bit line precharge voltage generation unit including a conventional operational amplifier and pumping capacitor, a transfer gate for charging/discharging the pumping capacitor is provided, or a control signal for directly driving the pumping capacitor is supplied. Because of this, the precharge operation of a bit line can be performed within a predetermined period of time, and simultaneously, a capacitance area of the pumping capacitor can be reduced, which increases the speed of the circuit operation of a semiconductor memory device, and reduces a layout area.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory device, comprising: a plurality of memory cells; paired bit lines connected to the plurality of memory cells; a plurality of precharge circuits for precharging the paired bit lines to a predetermined precharge voltage in accordance with a first control signal; and a bit line precharge voltage generation unit for supplying a voltage for precharging to the plurality of precharge circuits, an equalizing voltage of the paired bit lines being different from the precharge voltage, the bit line precharge voltage generation unit comprising:

a precharge voltage generation circuit for generating the precharge voltage and supplying the precharge voltage to the plurality of precharge circuits; and a precharge voltage pumping circuit including a pumping capacitor, a first switch for connecting a first electrode of the pumping capacitor to a first power source, a second switch for connecting the first electrode to an output node of the precharge voltage generation circuit, a third switch for connecting a second electrode of the pumping capacitor to the first power source, a fourth switch for connecting the second electrode to a second power source, and a control circuit for controlling on/off of the first, second, third, and fourth switches.

2. The semiconductor memory device according to claim 1, wherein the first, second, third, and fourth switches and the pumping capacitor are composed of MOS transistors.

3. The semiconductor memory device according to claim 1, wherein the semiconductor memory device has a plurality of gate oxide film thicknesses, and the first, second, third, and fourth switches and the pumping capacitor are composed of MOS transistors with a thick gate oxide film thickness.

4. The semiconductor memory device according to claim 1, wherein the semiconductor memory device has a plurality of gate oxide film thicknesses, and the first, second, third, and fourth switches and the pumping capacitor are composed of MOS transistors with a thin gate oxide film thickness.

5. The semiconductor memory device according to claim 1, wherein the control circuit of the precharge voltage pumping circuit controls the second switch and the third switch so as to turn them on during precharge or during a predetermined period of time from a commencement of precharge, and controls the first switch and the fourth switch so as to turn them on during the other period of time.

6. The semiconductor memory device according to claim 1, wherein the first control signal is a bit line precharge starting signal to the precharge circuit.

7. The semiconductor memory device according to claim 1, wherein the semiconductor memory device has a first well region of an N-channel MOS transistor and a second well region of a P-channel MOS transistor, and a MOS transistor constituting the pumping capacitor is a transistor in the second well region.

8. The semiconductor memory device according to claim 1, wherein the semiconductor memory device has a triple-well region including a first well region of an N-channel MOS transistor, a second well region of a P-channel MOS transistor, and a third well region of an N-channel MOS transistor, and a MOS transistor constituting the pumping capacitor is a transistor in the third well region.

9. The semiconductor memory device according to claim 1, wherein the first electrode of the pumping capacitor is composed of a gate electrode of a MOS transistor, and the second electrode is composed of a source, a drain, and a substrate of a MOS transistor connected to each other.

10. The semiconductor memory device according to claim 1, wherein the first electrode of the pumping capacitor is composed of a source, a drain, and a substrate of a MOS transistor connected to each other, and the second electrode is composed of a gate electrode of a MOS transistor.

11. The semiconductor memory device according to claim 1, wherein the pumping capacitor uses a plurality of wiring layers in the semiconductor memory device as electrodes, and is composed of capacitance formed between the wiring layers.

12. The semiconductor memory device according to claim 1, wherein the plurality of memory cells are formed in a plurality of memory cell array blocks capable of being activated individually, and the precharge voltage pumping circuit is disposed so as to be paired with each of the memory cell array blocks.

13. The semiconductor memory device according to claim 1, wherein the plurality of memory cells are formed in a plurality of memory cell array blocks capable of being activated individually, and the precharge voltage pumping circuit is disposed so as to be paired with each of the memory cell array blocks and is operated in accordance with a transition from a non-precharged state to a precharged state of each of the memory cell array blocks.

14. The semiconductor memory device according to claim 1, wherein the plurality of memory cells are formed in a plurality of memory cell array blocks capable of being activated individually, and the precharge voltage pumping circuit is disposed so as to be paired with each of the memory cell array blocks and is operated based on a bit line precharge starting signal to the precharge circuit in the memory cell array block.

15. The semiconductor memory device according to claim 12, wherein the bit line precharge voltage generation unit is disposed on one side of the memory cell array block so as to be in parallel with a sense amplifier string.

16. The semiconductor memory device according to claim 12, wherein the bit line precharge voltage generation unit is disposed on one side of the memory cell array block so as to be adjacent to the precharge circuit string.

17. The semiconductor memory device according to claim 12, wherein the bit line precharge voltage generation unit is disposed on one side of the memory cell array block so as to be placed in a row decoder block or so as to be in parallel with a row decoder string.

18. The semiconductor memory device according to claim 12, wherein the bit line precharge voltage generation unit is disposed on one side of the memory cell array block so as to be opposed to a row decoder block with the memory cell array block interposed therebetween.

19. A semiconductor memory device, comprising: a plurality of memory cells; paired bit lines connected to the plurality of memory cells; a plurality of precharge circuits for precharging the paired bit lines to a predetermined precharge voltage in accordance with a first control signal; and a bit line precharge voltage generation unit for supplying a voltage for precharging to the plurality of precharge circuits, an equalizing voltage of the paired bit lines being different from the precharge voltage, the bit line precharge voltage generation unit comprising:

a precharge voltage generation circuit for generating the precharge voltage and supplying the precharge voltage to the plurality of precharge circuits; and a precharge voltage pumping circuit including a pumping capacitor, a first switch for connecting a first electrode of the pumping capacitor to a first power source, a second switch for connecting the first electrode to an output node of the precharge voltage generation circuit, and a control circuit for controlling on/off of the first and second switches, wherein a second electrode of the pumping capacitor is driven with a second control signal.

20. The semiconductor memory device according to claim 19, wherein the first control signal is a bit line precharge starting signal to the precharge circuit.

21. The semiconductor memory device according to claim 19, wherein the first control signal also functions as the second control signal.

22. The semiconductor memory device according to claim 19, wherein the first and second switches and the pumping capacitor are composed of MOS transistors.

23. The semiconductor memory device according to claim 19, wherein the semiconductor memory device has a plurality of gate oxide film thicknesses, and the first and second switches and the pumping capacitor are composed of MOS transistors with a thick gate oxide film thickness.

24. The semiconductor memory device according to claim 19, wherein the semiconductor memory device has a plurality of gate oxide film thicknesses, and the first and second switches and the pumping capacitor are composed of MOS transistors with a thin gate oxide film thickness.

25. The semiconductor memory device according to claim 19, wherein the control circuit of the precharge voltage pumping circuit controls the second switch so as to turn it on with the first control signal during precharge or during a predetermined period of time from a commencement of precharge, and is operated so that charge in the pumping capacitor is transferred to an output node of the precharge voltage generation circuit with the second control signal.

26. The semiconductor memory device according to claim 19, wherein the semiconductor memory device has a first well region of an N-channel MOS transistor and a second well region of a P-channel MOS transistor, and a MOS transistor constituting the pumping capacitor is a transistor in the second well region.

27. The semiconductor memory device according to claim 19, wherein the semiconductor memory device has a triple-well region including a first well region of an N-channel MOS transistor, a second well region of a P-channel MOS transistor, and a third well region of an N-channel MOS transistor, and a MOS transistor constituting the pumping capacitor is a transistor in the third well region.

28. The semiconductor memory device according to claim 19, wherein the first electrode of the pumping capacitor is composed of a gate electrode of a MOS transistor, and the second electrode is composed of a source, a drain, and a substrate of a MOS transistor connected to each other.

29. The semiconductor memory device according to claim 19, wherein the first electrode of the pumping capacitor is composed of a source, a drain, and a substrate of a MOS transistor connected to each other, and the second electrode is composed of a gate electrode of a MOS transistor.

30. The semiconductor memory device according to claim 19, wherein the pumping capacitor uses a plurality of wiring layers in the semiconductor memory device as electrodes, and is composed of capacitance formed between the wiring layers.

31. The semiconductor memory device according to claim 19, wherein the plurality of memory cells are formed in a plurality of memory cell array blocks capable of being activated individually, and the precharge voltage pumping circuit is disposed so as to be paired with each of the memory cell array blocks.

32. The semiconductor memory device according to claim 19, wherein the plurality of memory cells are formed in a plurality of memory cell array blocks capable of being activated individually, and the precharge voltage pumping circuit is disposed so as to be paired with each of the memory cell array blocks and is operated in accordance with a transition from a non-precharged state to a precharged state of each of the memory cell array blocks.

33. The semiconductor memory device according to claim 19, wherein the plurality of memory cells are formed in a plurality of memory cell array blocks capable of being activated individually, and the precharge voltage pumping circuit is disposed so as to be paired with each of the memory cell array blocks and is operated based on a bit line precharge starting signal to the precharge circuit in the memory cell array block.

34. The semiconductor memory device according to claim 31, wherein the bit line precharge voltage generation unit is disposed on one side of the memory cell array block so as to be in parallel with a sense amplifier string.

35. The semiconductor memory device according to claim 31, wherein the bit line precharge voltage generation unit is disposed on one side of the memory cell array block so as to be adjacent to the precharge circuit string.

36. The semiconductor memory device according to claim 31, wherein the bit line precharge voltage generation unit is disposed on one side of the memory cell array block so as to be placed in a row decoder block or so as to be in parallel with a row decoder string.

37. The semiconductor memory device according to claim 31, wherein the bit line precharge voltage generation unit is disposed on one side of the memory cell array block so as to be opposed to a row decoder block with the memory cell array block interposed therebetween.

38. The semiconductor memory device according to claim 19, wherein a voltage amplitude of the second control signal is substantially the same as a voltage amplitude of a word line connected to the plurality of memory cells.

39. A semiconductor memory device, comprising: a plurality of memory cells; paired bit lines connected to the plurality of memory cells; a plurality of precharge circuits for precharging the paired bit lines to a predetermined precharge voltage in accordance with a first control signal; and a bit line precharge voltage generation unit for supplying a voltage for precharging to the plurality of precharge circuits, an equalizing voltage of the paired bit lines being different from the precharge voltage, the bit line precharge voltage generation unit comprising:

a precharge voltage generation circuit for generating the precharge voltage and supplying the precharge voltage to the plurality of precharge circuits; and a precharge voltage pumping circuit including a pumping capacitor, a first switch for connecting a first electrode of the pumping capacitor to a first power source, a second switch for connecting the first electrode to an output node of the precharge voltage generation circuit, and a control circuit for controlling on/off of the first and second switches, wherein a second electrode of the pumping capacitor is driven with a second control signal, wherein the second control signal rises during an activation period of a first control signal that is a bit line precharge starting signal to the precharge circuit.

40. A semiconductor memory device, comprising: a plurality of memory cells; paired bit lines connected to the plurality of memory cells; a plurality of precharge circuits for precharging the paired bit lines to a predetermined precharge voltage in accordance with a first control signal; and a bit line precharge voltage generation unit for supplying a voltage for precharging to the plurality of precharge circuits, an equalizing voltage of the paired bit lines being different from the precharge voltage, the bit line precharge voltage generation unit comprising:

a precharge voltage generation circuit for generating the precharge voltage and supplying the precharge voltage to the plurality of precharge circuits; and a precharge voltage pumping circuit including a pumping capacitor, a first switch for connecting a first electrode of the pumping capacitor to a first power source, a second switch for connecting the first electrode to an output node of the precharge voltage generation circuit, a control circuit for controlling on/off of the first and second switches, and a precharge voltage pumping circuit for driving a second electrode of the pumping capacitor with a second control signal, wherein the second control signal rises with a transition time longer than a transition time of the first control signal, after a predetermined delay time from activation of the first control signal that is a bit line precharge starting signal to the precharge circuit.

41. A semiconductor device with a semiconductor memory device and a logic circuit device therein, wherein the semiconductor memory device includes: a plurality of memory cells; paired bit lines connected to the plurality of memory cells; a plurality of precharge circuits for precharging the paired bit lines to a predetermined precharge voltage in accordance with a first control signal; and a bit line precharge voltage generation unit for supplying a voltage for precharging to the plurality of precharge circuits, an equalizing voltage of the paired bit lines being different from the precharge voltage, the bit line precharge voltage generation unit includes:

a precharge voltage generation circuit for generating the precharge voltage and supplying the precharge voltage to the plurality of precharge circuits; and a precharge voltage pumping circuit including a pumping capacitor, a first switch for connecting a first electrode of the pumping capacitor to a first power source, a second switch for connecting the first electrode to an output node of the precharge voltage generation circuit, a control circuit for controlling on/off of the first and second switches, and a precharge voltage pumping circuit for driving a second electrode of the pumping capacitor with a second control signal, and a voltage amplitude of the second control signal is substantially the same as a voltage amplitude of a signal in the logic circuit device.

42. A semiconductor device with a semiconductor memory device and a logic circuit device therein, wherein the semiconductor memory device includes: a plurality of memory cells; paired bit lines connected to the plurality of memory cells; a plurality of precharge circuits for precharging the paired bit lines to a predetermined precharge voltage in accordance with a first control signal; and a bit line precharge voltage generation unit for supplying a voltage for precharging to the plurality of precharge circuits, an equalizing voltage of the paired bit lines being different from the precharge voltage, the bit line precharge voltage generation unit includes:

a precharge voltage generation circuit for generating the precharge voltage and supplying the precharge voltage to the plurality of precharge circuits; and a precharge voltage pumping circuit including a pumping capacitor, a first switch for connecting a first electrode of the pumping capacitor to a first power source, a second switch for connecting the first electrode to an output node of the precharge voltage generation circuit, a control circuit for controlling on/off of the first and second switches, and a precharge voltage pumping circuit for driving a second electrode of the pumping capacitor with a second control signal, the second control signal rises during an activation period of a first control signal that is a bit line precharge starting signal to the precharge circuit, and a voltage amplitude of the second control signal is substantially the same as a voltage amplitude of a signal in the logic circuit device.

43. A semiconductor device with a semiconductor memory device and a logic circuit device therein, wherein the semiconductor memory device includes: a plurality of memory cells; paired bit lines connected to the plurality of memory cells; a plurality of precharge circuits for precharging the paired bit lines to a predetermined precharge voltage in accordance with a first control signal; and a bit line precharge voltage generation unit for supplying a voltage for precharging to the plurality of precharge circuits, an equalizing voltage of the paired bit lines being different from the precharge voltage, the bit line precharge voltage generation unit includes:

a precharge voltage generation circuit for generating the precharge voltage and supplying the precharge voltage to the plurality of precharge circuits; and a precharge voltage pumping circuit including a pumping capacitor, a first switch for connecting a first electrode of the pumping capacitor to a first power source, a second switch for connecting the first electrode to an output node of the precharge voltage generation circuit, a control circuit for controlling on/off of the first and second switches, and a precharge voltage pumping circuit for driving a second electrode of the pumping capacitor with a second control signal, the second control signal rises with a transition time longer than a transition time of the first control signal, after a predetermined delay time from activation of the first control signal that is a bit line precharge signal to the precharge circuit, and a voltage amplitude of the second control signal is substantially the same as a voltage amplitude of a signal in the logic circuit device.

* * * * *